(12) United States Patent
Aoki

(10) Patent No.: US 9,363,022 B2
(45) Date of Patent: Jun. 7, 2016

(54) OPTICAL TRANSMISSION APPARATUS AND ANALOG-TO-DIGITAL CONVERSION APPARATUS

(75) Inventor: Yasuhiko Aoki, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 676 days.

(21) Appl. No.: 13/316,519

(22) Filed: Dec. 11, 2011

(65) Prior Publication Data

US 2012/0177368 A1    Jul. 12, 2012

(30) Foreign Application Priority Data

Jan. 7, 2011 (JP) ................................. 2011-001880

(51) Int. Cl.
| | |
|---|---|
| H04B 10/00 | (2013.01) |
| H04J 14/00 | (2006.01) |
| H04J 14/02 | (2006.01) |
| H04B 10/61 | (2013.01) |
| H04B 10/69 | (2013.01) |
| H03M 1/10 | (2006.01) |
| H03M 1/12 | (2006.01) |

(52) U.S. Cl.
CPC ........... *H04B 10/616* (2013.01); *H03M 1/1061* (2013.01); *H04B 10/6931* (2013.01); *H03M 1/1215* (2013.01)

(58) Field of Classification Search
CPC ... H03M 1/1061; H03M 1/1215; H03M 1/12; H04B 10/616; H04B 10/6931; H04B 10/24; H04B 10/08; H04Q 11/0005; H04Q 11/0066; H04Q 11/0067; H04Q 2011/003; H04Q 2011/0032; H04Q 2011/0035; H04Q 2011/0041; H04Q 2011/0079; H04Q 2011/0088; H04Q 2011/009

USPC ............ 398/38, 135, 136, 158, 50, 115, 117, 398/79; 341/155
See application file for complete search history.

(56) References Cited

U.S. PATENT DOCUMENTS

| | | | | |
|---|---|---|---|---|
| 6,289,044 | B1 * | 9/2001 | Velez ................... | H03G 3/3052 375/222 |
| 6,445,319 | B1 * | 9/2002 | Bugeja ................ | H03M 1/1038 341/138 |
| 7,215,266 | B2 * | 5/2007 | Li ....................... | H03M 1/1019 341/118 |
| 7,346,318 | B2 * | 3/2008 | Tsutsui ................ | H03F 1/0244 330/130 |
| 7,603,094 | B2 * | 10/2009 | Rahman ................. | A61B 5/00 600/301 |

(Continued)

FOREIGN PATENT DOCUMENTS

| | | | | |
|---|---|---|---|---|
| GB | 2246255 A | * | 1/1992 | ................ G01S 3/02 |
| JP | 2006-319427 A | | 11/2006 | |

(Continued)

*Primary Examiner* — Ken N Vanderpuye
*Assistant Examiner* — Abbas H Alagheband
(74) *Attorney, Agent, or Firm* — Fujitsu Patent Center

(57) ABSTRACT

In an optical transmission apparatus, an optical-to-electrical converter converts a received optical signal into an electrical signal, and an amplifier amplifies the resulting electrical signal. A plurality of analog-to-digital converters then convert the amplified electrical signal from analog form to digital form in a time-interleaved manner to produce digital outputs. When correcting the analog-to-digital converters, a controller varies the gain of the amplifier in such a way that a total amplitude or an average amplitude indicated by the digital outputs of the analog-to-digital converters will be equal to or greater than a specified threshold.

9 Claims, 22 Drawing Sheets

(56) References Cited

U.S. PATENT DOCUMENTS

| | | | | |
|---|---|---|---|---|
| 8,050,367 | B2 * | 11/2011 | Ichihara | H04L 7/042 375/360 |
| 8,131,148 | B2 * | 3/2012 | Sun | H03G 3/001 375/316 |
| 8,340,602 | B1 * | 12/2012 | Peiris | H04B 10/0799 398/158 |
| 8,951,190 | B2 * | 2/2015 | Chmiel | H03F 1/0227 330/127 |
| 2001/0052864 | A1 * | 12/2001 | Shimizu | H03M 1/0673 341/141 |
| 2002/0012152 | A1 * | 1/2002 | Agazzi | H03M 1/0624 398/202 |
| 2003/0156666 | A1 * | 8/2003 | Nichols | H03G 3/3052 375/345 |
| 2005/0062491 | A1 * | 3/2005 | Burns | G01R 31/2607 324/750.3 |
| 2005/0258989 | A1 * | 11/2005 | Li | H03M 1/1019 341/120 |
| 2006/0261992 | A1 * | 11/2006 | Lusky | H03M 1/185 341/155 |
| 2008/0063220 | A1 * | 3/2008 | Lin | H03F 1/52 381/120 |
| 2008/0248770 | A1 * | 10/2008 | Schultz | H04B 1/005 455/188.1 |
| 2008/0267638 | A1 * | 10/2008 | Nakashima | H04B 10/60 398/208 |
| 2009/0047030 | A1 * | 2/2009 | Hoshida | H04B 10/60 398/205 |
| 2009/0323865 | A1 * | 12/2009 | Bradley | 455/241.1 |
| 2010/0316175 | A1 * | 12/2010 | Zeng | H03G 3/3052 375/330 |
| 2013/0281035 | A1 * | 10/2013 | Ly-Gagnon | H04B 1/0475 455/114.3 |
| 2013/0307616 | A1 * | 11/2013 | Berchtold | H03F 3/24 455/115.1 |

FOREIGN PATENT DOCUMENTS

| | | |
|---|---|---|
| JP | 2007-147472 A | 6/2007 |
| JP | 2008-278249 A | 11/2008 |
| JP | 2010-41495 A | 2/2010 |

* cited by examiner

FIG. 11

52 TIA SETTING TABLE

| INPUT AMPLITUDE | OPERATION-MODE AMPLITUDE CONTROL VOLTAGE | CORRECTION-MODE AMPLITUDE CONTROL VOLTAGE |
|---|---|---|
| Ia | Va1 | Vb1 |
| Ib | Va2 | Vb2 |
| ⋮ | ⋮ | ⋮ |
| Iz | Van | Vbn |

OPTICAL TRANSMISSION APPARATUS AND ANALOG-TO-DIGITAL CONVERSION APPARATUS

CROSS-REFERENCE TO RELATED APPLICATION

This application is based upon and claims the benefit of priority of the prior Japanese Patent Application No. 2011-001880, filed on Jan. 7, 2011, the entire contents of which are incorporated herein by reference.

FIELD

The embodiments discussed herein relate to an optical transmission apparatus which transmits and receives optical signals, as well as to an analog-to-digital conversion apparatus which converts signals from analog form to digital form.

BACKGROUND

New standards for high-speed transport have been developed for use in wavelength-division multiplexed (WDM) optical communications systems. For example, the Optical Channel Transport Unit-4 (OTU4) has a line rate to transport Ethernet® client signals whose bitrate is in the order of 100 Gbit/s per channel. As a modulation-demodulation technique to achieve this high line rate in long-haul signal transmission, the researchers have investigated the use of, for example, dual-polarization quadrature phase shift keying (DP-QPSK). DP-QPSK performs a four-level phase modulation on each of the orthogonally polarized light waves that propagate over a fiber optic link. To meet the future need for a wider bandwidth, the systems may employ an enhanced multilevel modulation scheme, such as 16 quadrature amplitude modulation (16QAM), that provides more than four levels. Other promising modulation schemes include orthogonal frequency division multiplexing (OFDM).

For reception of optical signals, techniques using coherent detection and digital signal processing have widely been studied. For example, the receiver in an optical transmission apparatus has a photo diode (PD) to convert a received optical transmission signal to an analog electrical signal. A transimpedance amplifier (TIA) or the like is used to amplify the electrical signal up to a desired level before it is converted to a digital signal with an analog-to-digital converter (ADC) circuit.

In the above-noted high-speed applications, the ADC circuit has to handle 100-Gbit/s optical signals. Such a high-speed analog-to-digital conversion may be realized by using, for example, a plurality of relatively slow ADCs configured to operate in a time-interleaved manner (i.e., the sampling times of ADCs are staggered in time). In this time-interleaved architecture, uniform amplitude characteristics of the constituent ADCs and accurate setup of their conversion timings are key factors for proper ADC operation. Adjustment processing is therefore performed to correct amplitude errors and timing errors of ADCs before the optical transmission apparatus is put into operation. ADC correction may also take place at the time of maintenance, for example.

As an example of related art, there is proposed an optical receiver that regulates the per-channel signal level of its radio frequency (RF) output, regardless of variations in the input level, deterioration and temperature dependence of gain characteristics of a variable gain amplifier, or changes in the number of channels (see, for example, Japanese Laid-open Patent Publication No. 2010-41495). Another example is an optical receiver that provides a wide dynamic range and a high accuracy in monitoring optical signals (see, for example, Japanese Laid-open Patent Publication No. 2006-319427).

As mentioned above, a received optical transmission signal is converted into an electrical signal, and this electrical signal is amplified by an amplifier before it is subjected to A/D conversion. Generally, amplifiers for this purpose are configured to operate in their linear range when the optical transmission apparatus is in operation mode, to degrade the received transmission signal by nonlinear distortion.

Linear operation of an amplifier is achieved by, for example, setting it up with a relatively low gain. This low gain setup is also effective during the ADC correction described above. Accordingly the ADC circuit is corrected without the chance of receiving large-amplitude signals. This could lead, however, to degradation of transmission signals when the optical transmission apparatus is put into operation. For example, when the optical transmission apparatus is in operating mode, the ADC circuit may received a signal with an amplitude larger than those used in the previous ADC correction. The ADC may not be able to convert the received transmission signal properly because of this difference in the signal amplitude conditions.

SUMMARY

According to an aspect of the invention, there is provided an optical transmission apparatus which receives and transmits optical signals. The proposed apparatus includes the following elements: an optical-to-electrical converter which converts a received optical signal into an electrical signal; an amplifier which amplifies the electrical signal; a plurality of analog-to-digital converters which convert the amplified electrical signal from analog form to digital form in a time-interleaved manner to produce digital outputs; and a controller which varies gain of the amplifier when correcting the analog-to-digital converters, in such a way that a total amplitude or an average amplitude indicated by the digital outputs of the analog-to-digital converters is equal to or greater than a specified threshold.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 11 illustrates example data of a TIA setting table;

DESCRIPTION OF EMBODIMENTS

Figure 1:
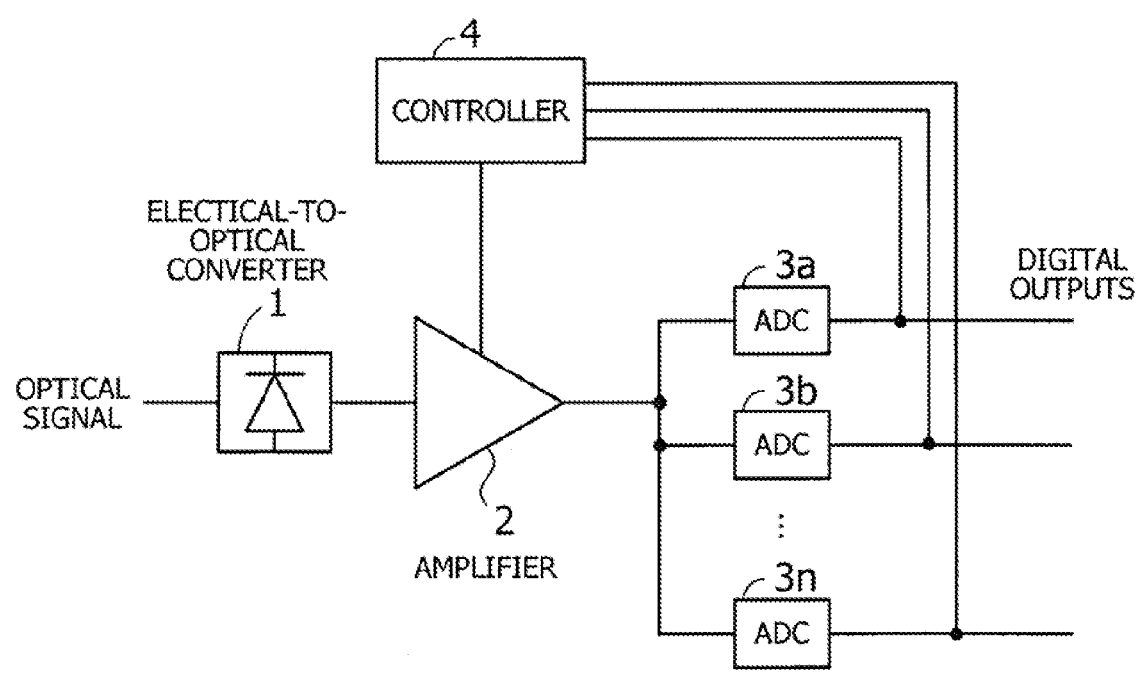
FIG. 1 illustrates an example of an optical transmission apparatus according to a first embodiment.

Several embodiments will be described below with reference to the accompanying drawings, wherein like reference numerals refer to like elements throughout.

(a) First Embodiment

FIG. 1 illustrates an example of an optical transmission apparatus according to a first embodiment. The illustrated optical transmission apparatus includes an optical-to-electrical converter 1, an amplifier 2, analog-to-digital converters (ADC) 3a to 3n, and a controller 4.

The optical transmission apparatus receives an optical signal. The optical-to-electrical converter 1 converts this optical signal to an electrical signal. The amplifier 2 amplifies the electrical signal produced by the optical-to-electrical converter 1. The electrical signal amplified by the amplifier 2 is then directed to a plurality of ADCs 3a to 3n in parallel, so that analog-to-digital conversion of the amplified electrical signal is performed in a time-interleaved manner. That is, the given electrical signal is AD-converted by a plurality of ADCs 3a to 3n at successively staggered sample times. This time-interleaving technique enables the ADCs 3a to 3n as a whole to convert the amplified electrical signal at a high rate (i.e., at short intervals) even though the individual ADCs may be relatively slow.

The controller 4 varies the gain of the amplifier 2 when correcting the ADCs 3a to 3n, in such a way that the total amplitude or average amplitude indicated by digital outputs of the ADCs 3a to 3n will be equal to or greater than a specified threshold. Specifically, the ADCs 3a to 3n is corrected by using a pseudorandom signal as their input to correct errors in their amplitudes and conversion timings. The controller 4 increases the gain of the amplifier 2 if the total output amplitude or average output amplitude of those ADCs 3a to 3n is smaller than a specified threshold.

Generally the amplifier 2 is supposed to operate in its linear range when the optical transmission apparatus is in operation, in order to prevent the received transmission signal from being degraded by nonlinear distortion of the amplifier 2. The amplifier 2 is thus configured to have a relatively small gain, not to bring the signal into its nonlinear range. Conventionally the ADCs 3a to 3n are corrected without changing that gain setting of the amplifier 2. When the optical transmission apparatus is put into operation, the ADCs 3a to 3n may receive a signal with an amplitude level that they have not experienced in the previous ADC correction. The discrepancy in signal amplitudes between correction mode and operation mode could lead to poor reception of the transmission signal.

For the above reason, the controller 4 is designed to vary the gain of the amplifier 2 in such a way that the total amplitude or average amplitude of digital outputs of the ADCs 3a to 3n will be equal to or greater than a specified threshold. This control permits the correction of ADCs 3a to 3n to be performed with an input signal amplitude that is close to the full scale amplitude defined as part of operating conditions about input signals of the optical transmission apparatus.

The proposed optical transmission apparatus corrects its ADCs 3a to 3n by controlling the gain of the amplifier 2 such that the total amplitude or average amplitude of their digital outputs will be equal to or greater than a specified threshold. With this feature of gain control, the correction brings the ADCs 3a to 3n into a more satisfactory state.

(b) Second Embodiment

Figure 2:
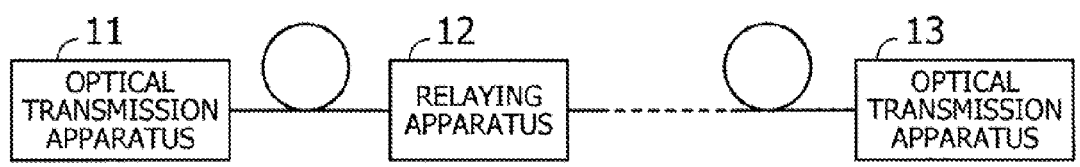
FIG. 2 illustrates an example of an optical communications system including optical transmission apparatuses according to a second embodiment.

A second embodiment is described in detail below with reference to FIG. 2 and subsequent drawings. FIG. 2 illustrates an example of an optical communications system including optical transmission apparatuses according to the second embodiment. Specifically, the illustrated system is formed from two optical transmission apparatuses 11 and 13 and a relaying apparatus 12, which are connected in series by, for example, fiber optic links.

For example, the optical transmission apparatuses 11 and 13 receive electrical signals from lower-layer network devices (not illustrated), convert the received signals into optical form, and transmit the resulting optical signals to subsequent apparatuses. The optical transmission apparatuses 11 and 13 also receive optical signals from each other, convert them into electrical form, and transmit the resulting electrical signals to the lower-layer devices. The relaying apparatus 12 is placed between the two optical transmission apparatuses 11 and 13 to compensate for attenuation of optical signals propagating over the fiber optic transmission line. The relaying apparatus 12 may have optical add/drop multiplexing (OADM) functions to extract particular wavelengths.

Figure 3:
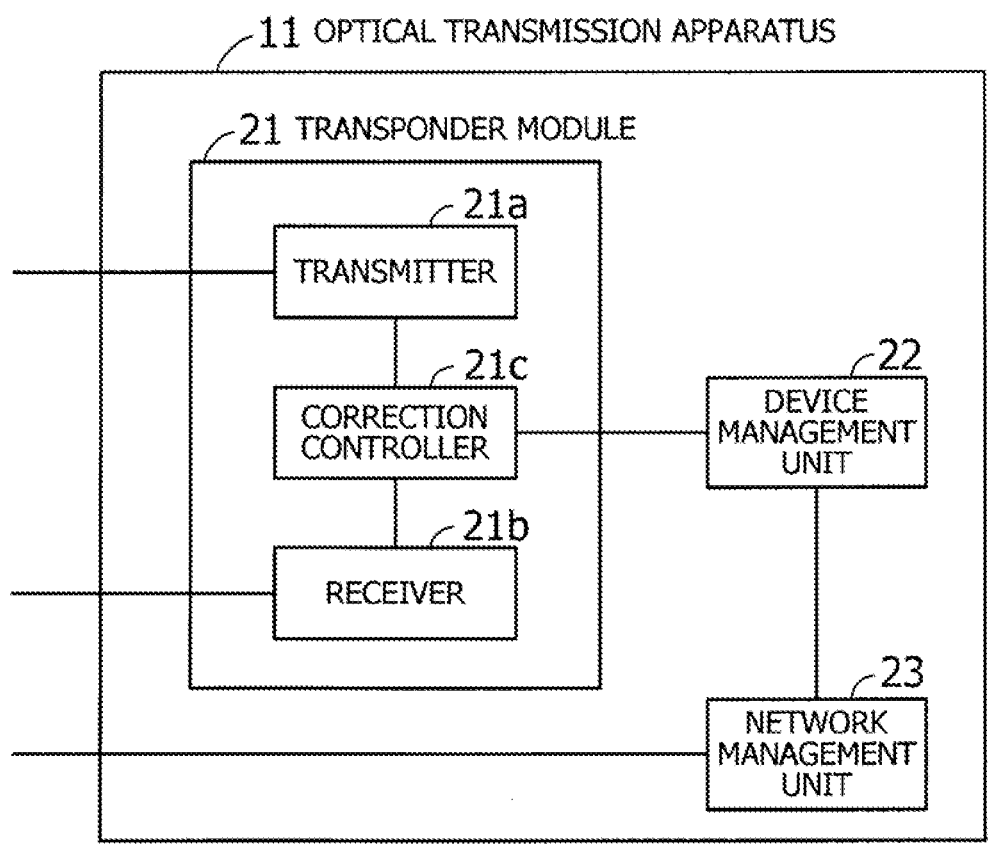
FIG. 3 is a block diagram illustrating an example of an optical transmission apparatus.

FIG. 3 is a block diagram illustrating an example of an optical transmission apparatus. The illustrated optical transmission apparatus 11 includes a transponder module 21, a device management unit 22, and a network management unit 23. This block diagram of FIG. 3, as well as the following description of the optical transmission apparatus 11, similarly applies to the other optical transmission apparatus 13 in FIG. 2.

The transponder module 21 receives and transmits optical signals. To this end, the transponder module 21 includes a transmitter 21a, a receiver 21b, and a correction controller 21c. The transmitter 21a receives an electrical transmission signal destined for, for example, a peer optical transmission apparatus 13 and converts the received transmission signal into an optical signal for transmission on a fiber optic link. As will be described in detail below, the transmitter 21a may produce a pseudorandom bit sequence (PRBS) according to a command from the correction controller 21c and transmits it to the peer optical transmission apparatus 13 via a fiber optic link.

The receiver 21b receives an optical transmission signal transmitted from, for example, the peer optical transmission apparatus 13 via a fiber optic link and converts the received transmission signal into an analog electrical signal. As will be described in detail below, the receiver 21b includes an A/D converter to convert an analog electrical signal into a digital signal. The correction controller 21c controls correction processing for this A/D converter in the receiver 21b when there is a request from the device management unit 22. For example, the correction processing in the optical transmission apparatus 11 begins with receiving a pseudorandom bit sequence transmitted from a peer optical transmission apparatus 13. This pseudorandom bit sequence is received by the receiver 21b, and the correction controller 21c uses it to correct the A/D converter in the receiver 21b.

The correction controller 21c may also receive a notification from the peer optical transmission apparatus which indicates that the peer optical transmission apparatus 13 is going to correct its own A/D converter. Upon receipt of this notification, the correction controller 21c causes the transmitter 21a to send a pseudorandom bit sequence to the peer optical transmission apparatus 13. The peer optical transmission apparatus 13 then executes correction of its A/D converter by using the pseudorandom bit sequence supplied from the transmitter 21a.

The device management unit 22 manages the entire system of the optical transmission apparatus 11. For example, the device management unit 22 sends a command to the correction controller 21c to correct the A/D converter in the receiver 21b when the optical transmission apparatus 11 begins operation in the optical network. For another example, the device management unit 22 may send a command to the correction controller 21c to correct the A/D converter in response to an operator instruction when the optical transmission apparatus 11 is in maintenance.

When starting correction processing of the A/D converter, the device management unit 22 so notifies the peer optical transmission apparatus 13. Upon receipt of this notification from the device management unit 22, the peer optical transmission apparatus 13 transmits a pseudorandom bit sequence to the optical transmission apparatus 11.

The network management unit 23 may communicate with other devices on the optical network. For example, the network management unit 23 communicates with the relaying apparatus 12 (FIG. 2) and peer optical transmission apparatus 13.

Figure 4:
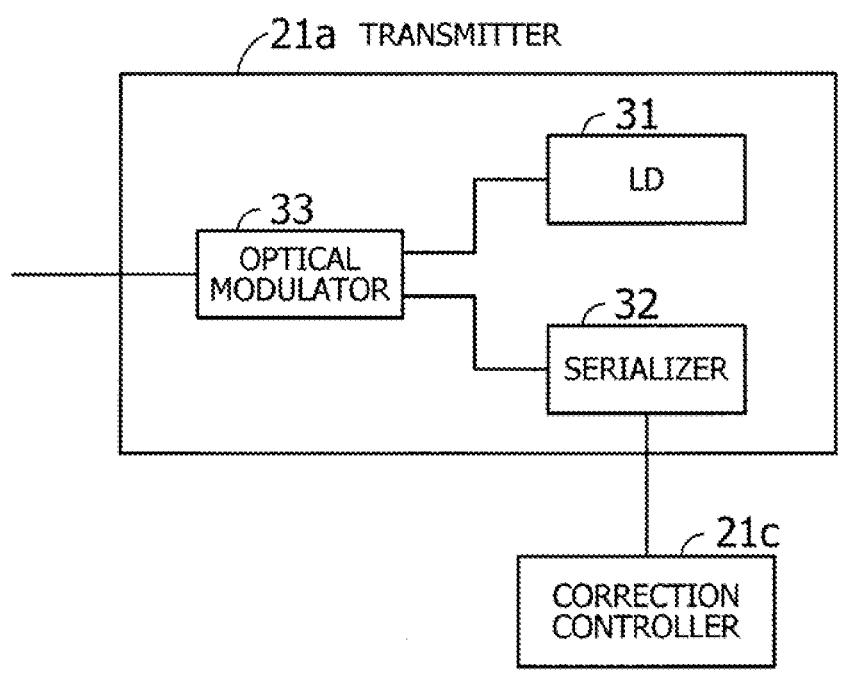
FIG. 4 is a block diagram illustrating an example of a transmitter.

Details of the transmitter 21a, receiver 21b, and correction controller 21c will now be described below. FIG. 4 is a block diagram illustrating an example of the transmitter 21a, together with the correction controller 21c discussed in FIG. 3. As can be seen in FIG. 4, the transmitter 21a includes a laser diode (LD) 31, a serializer 32, and an optical modulator 33.

The laser diode 31 is the source of an optical signal to be transmitted over a fiber optic link. The light produced by the laser diode 31 is subjected to modulation at the optical modulator 33 described below. The serializer 32 receives, for example, parallel data signals destined for the peer optical transmission apparatus 13. The serializer 32 converts the received parallel data signals into a serial data signal and outputs it to the optical modulator 33. The serializer 32 also outputs a pseudorandom bit sequence. Coupled to the correction controller 21c discussed in FIG. 3, the serializer 32 supplies the optical modulator 33 with either a pseudorandom bit sequence or a data signal, according to commands from the correction controller 21c.

The optical modulator 33 modulates the output light of the laser diode 31 by using a signal supplied from the serializer 32. The modulated light is delivered over a fiber optic link to, for example, the peer optical transmission apparatus 13.

Figure 5:
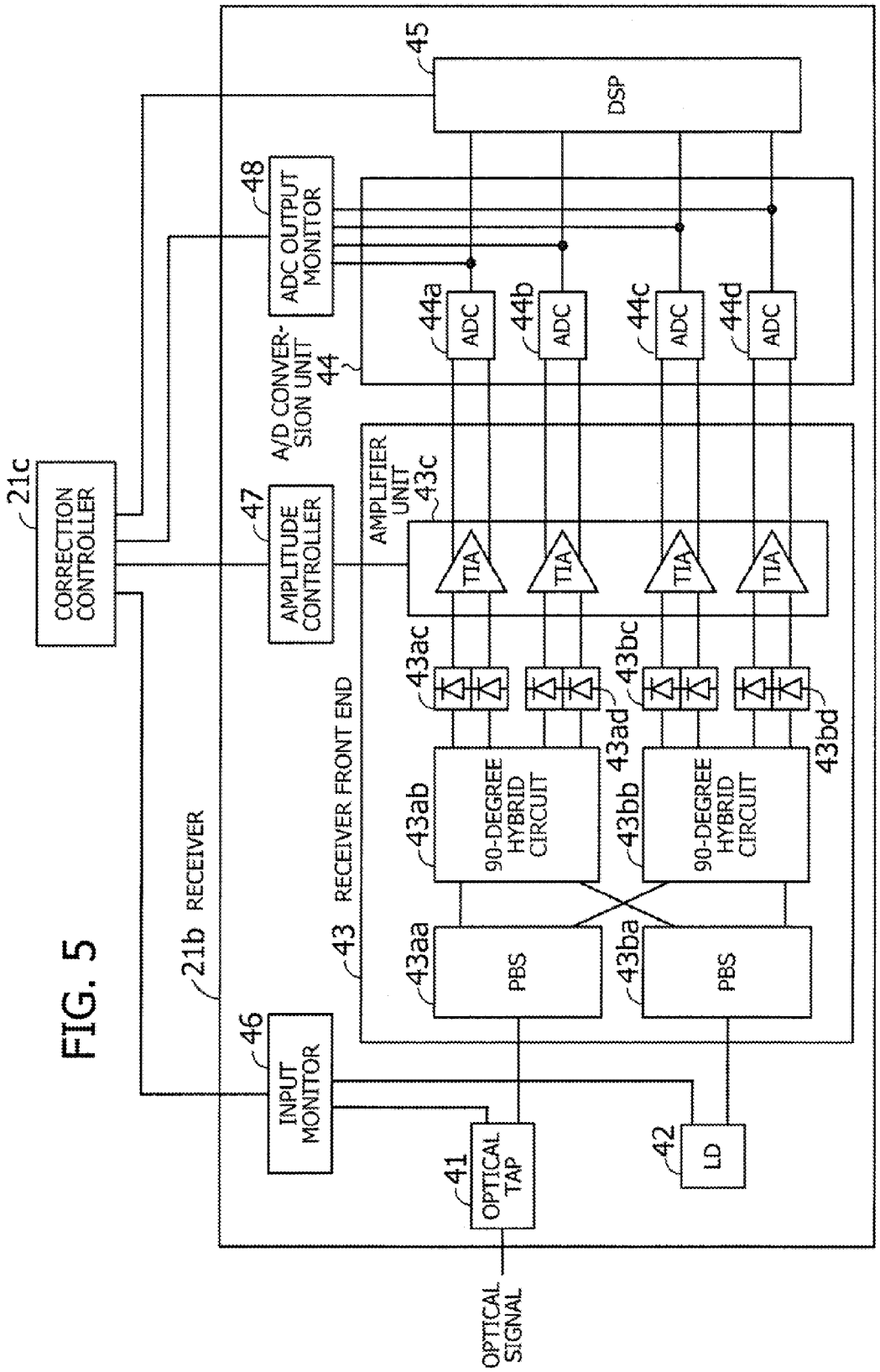
FIG. 5 is a block diagram illustrating an example of a receiver.

FIG. 5 is a block diagram illustrating an example of the receiver 21b. As can be seen in FIG. 5, the illustrated receiver 21b includes an optical tap 41, a laser diode 42, a receiver front end 43, an A/D conversion unit 44, a digital signal processor (DSP) 45, an input monitor 46, an amplitude controller 47, and an ADC output monitor 48. FIG. 5 also depicts the correction controller 21c discussed in FIG. 3.

The optical tap 41 is coupled to a fiber optic link to receive a transmission signal (optical signal). The optical tap 41 supplies the received optical signal to the input monitor 46 and one polarization beam splitter (PBS) 43aa in the receiver front end 43. The laser diode 42 outputs local oscillator (LO) light for the purpose of coherent reception of optical signals. The produced LO light is supplied to the input monitor 46 described below and another PBS 43ba in the receiver front end 43.

The receiver front end 43 includes PBSs 43aa and 43ba, 90-degree hybrid circuits 43ab and 43bb, photo diodes (PD) 43ac, 43ad, 43bc, and 43bd, and an amplifier unit 43c. One PBS 43aa receives an optical signal from the optical tap 41 and splits it into two orthogonally polarized components, referred to herein as horizontal and vertical components. The horizontal and vertical components of the received optical signal are then sent to two 90-degree hybrid circuits 43ab and 43bb, respectively. The other PBS 43ba receives LO light from the laser diode 42 and splits into two orthogonally polarized components. The resulting horizontal and vertical components of the LO light are then sent to the 90-degree hybrid circuits 43ab and 43bb, respectively.

One 90-degree hybrid circuit 43ab demodulates I and Q components of the optical signal by observing a beat between the horizontal optical signal component supplied from one PBS 43aa and the horizontal LO light component supplied from the other PBS 43ba. The demodulated I component of the optical signal is then sent to a photo diode 43ac, and the Q component of the same is sent to another photo diode 43ad. For example, these I and Q component signals may be supplied in the form of differential signals.

The other 90-degree hybrid circuit 43bb demodulates I and Q components of the optical signal by observing a beat between the vertical optical signal component supplied from one PBS 43aa and the vertical LO light component supplied from the other PBS 43ba. The demodulated I component of the optical signal is then sent to yet another photo diode 43bc, and the Q component of the same is sent to still another photo diode 43bd. For example, these I and Q component signals may be supplied in the form of differential signals.

The first photo diode 43ac performs an optical-to-electrical conversion on the I optical signal component supplied from one 90-degree hybrid circuit 43ab, thus producing an electrical signal (current signal). Similarly the second photo diode 43ad performs an optical-to-electrical conversion on the Q optical signal component supplied from the same 90-degree hybrid circuit 43ab. The third photo diode 43bc performs an optical-to-electrical conversion on the I optical signal component supplied from the other 90-degree hybrid circuit 43bb. The fourth photo diode 43bd performs an optical-to-electrical conversion on the Q optical signal component supplied from the same 90-degree hybrid circuit 43bb.

The amplifier unit 43c includes a plurality of amplifiers to boost electrical signals produced by the above-described photo diodes 43ac, 43ad, 43bc, and 43bd. For example, the amplifier unit 43c includes amplifiers, one for each photo diode. In the example illustrated in FIG. 5, the amplifier unit 43c includes four amplifiers corresponding to the photo diodes 43ac, 43ad, 43bc, and 43bd. For example, transimpedance amplifiers (TIAs) may be used to implement those amplifiers in the amplifier unit 43c, which convert current signals produced at the photo diodes 43ac, 43ad, 43bc, and 43bd into voltage signals. The gain of each amplifier contained in the amplifier unit 43c can be varied under the control of the amplitude controller 47. In other words, the amplifier unit 43c may vary its output signal amplitude. For example, the constituent amplifiers of the amplifier unit 43c may vary their respective gains according to the level of a voltage or power that is given by the amplitude controller 47. The description now assumes that the amplifier unit 43c contains TIAs as its constituent amplifiers.

The A/D conversion unit 44 is formed from four ADCs 44a to 44d to convert analog electrical signals from the amplifier unit 43c into digital signals. While FIG. 5 depicts only one ADC for each TIA in the amplifier unit 43c, those ADCs 44a to 44d are each composed of a plurality of constituent ADCs as will be described later. The DSP 45 reconstructs data bits from digital values produced by the A/D conversion unit 44. That is, the DSP 45 reproduces the original data transmitted by the sending apparatus.

The input monitor 46 is supplied with an optical signal from the optical tap 41, as well as LO light from the laser diode 42. The input monitor 46 monitors optical power levels of those signals and sends the monitoring result to the correction controller 21c. The amplitude controller 47 controls the gain of each TIA in the amplifier unit 43c according to commands from the correction controller 21c. The ADC output monitor 48 monitors a total amplitude (i.e., a sum of amplitude values observed during a specified period) or average amplitude (i.e., a temporal average of amplitude values over a specified period) of digital signals produced by the ADC 44a to 44d. The monitored total amplitude or average amplitude values are sent to the correction controller 21c individually or collectively for the ADCs 44a to 44d.

Figure 6:
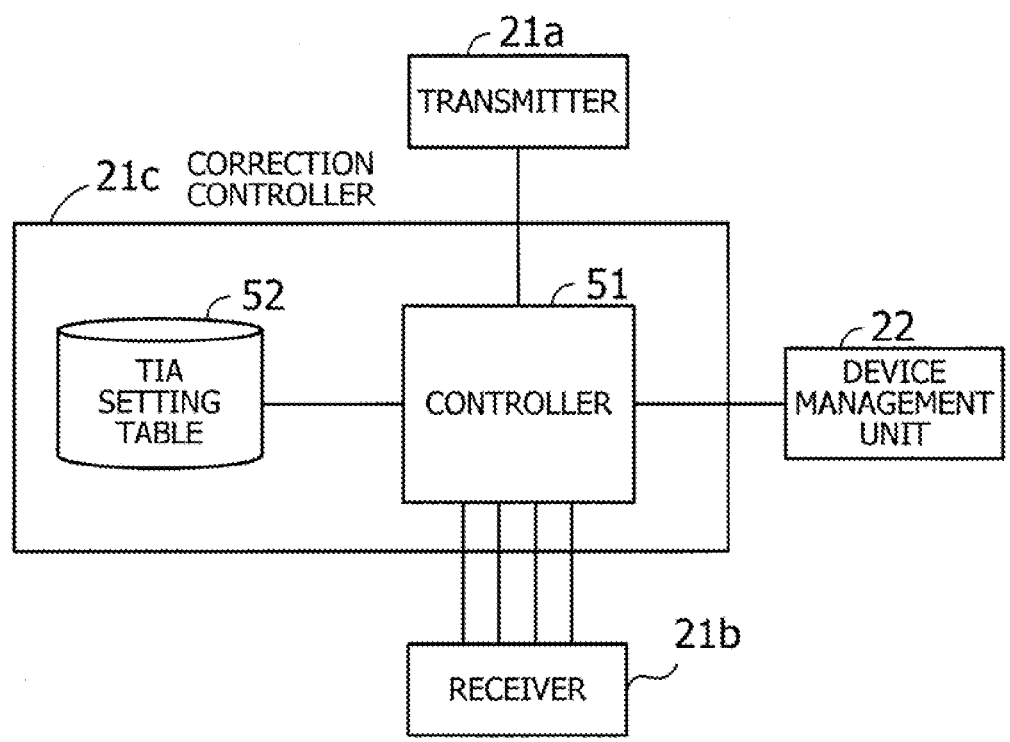
FIG. 6 is a block diagram illustrating an example of a correction controller.

FIG. 6 is a block diagram illustrating an example of a correction controller. As can be seen in FIG. 6, the illustrated correction controller 21c includes a controller 51 and a TIA setting table 52. FIG. 6 also depicts the transmitter 21a, receiver 21b, and device management unit 22 discussed in FIG. 3. While not depicted in detail, the controller 51 is coupled to the input monitor 46, amplitude controller 47, ADC output monitor 48, and DSP 45 in the foregoing receiver 21b of FIG. 5.

The controller 51 controls correction of the A/D conversion unit 44 when so requested by the device management unit 22. For example, the controller 51 commands the ADCs 44a to 44d to correct themselves to correct their errors. The ADCs 44a to 44d start a process of correcting their amplitude errors and timing errors by using a pseudorandom bit sequence sent from a peer optical transmission apparatus 13. During this process, the ADC output monitor 48 monitors digital signals produced by the ADCs 44a to 44d. The controller 51 obtains a total amplitude or average amplitude of those monitored signals and corrects the gain of TIAs via an amplitude controller in the receiver 21b in such a way that the obtained total amplitude or average amplitude of TIAs will be equal to or greater than a specified value.

In the receiver 21b, the amplitude controller 47 controls the gain of TIAs by, for example, changing a relevant voltage according to commands from the controller 51. The "specified value" may be set, for example, in a range that is above the total amplitude or average amplitude of digital signals observed when the optical transmission apparatus 11 is in operation mode and below the full-scale amplitude of ADCs 44a to 44d. Preferably the specified value is close to the full-scale amplitude.

Once the total amplitude or average amplitude of digital signals obtained from the ADC output monitor 48 has reached the specified value, the controller 51 further controls the gain of TIAs so that the total amplitude or average amplitude is brought into a specified range. The controller 51 terminates the correction process of ADCs 44a to 44d when their digital output signals exhibit a total amplitude or average amplitude that is equal to or greater than the specified value and also falls within the specified range. Then the controller 51 switches the operating mode of the optical transmission apparatus 11 from correction mode to operation mode.

The controller 51 may also receive a notification from the peer optical transmission apparatus via the device management unit 22 when that peer optical transmission apparatus 13 is going to correct its A/D converter. Upon receipt of this notification, the controller 51 commands the transmitter 21a to send a pseudorandom bit sequence to the peer optical transmission apparatus 13. In response to this command sent from the controller 51, the transmitter 21a causes its serializer 32 to produce a pseudorandom bit sequence.

The TIA setting table 52 stores various values of input voltage of TIA and their associated amplitude control voltages used to control the TIA gain. As will be described in detail below, the controller 51 determines an appropriate amplitude control voltage from this TIA setting table 52, based on a measurement of optical power monitored by the input monitor 46 and a total amplitude or average amplitude of ADCs 44a to 44d which is monitored by the ADC output monitor 48.

Figure 7:
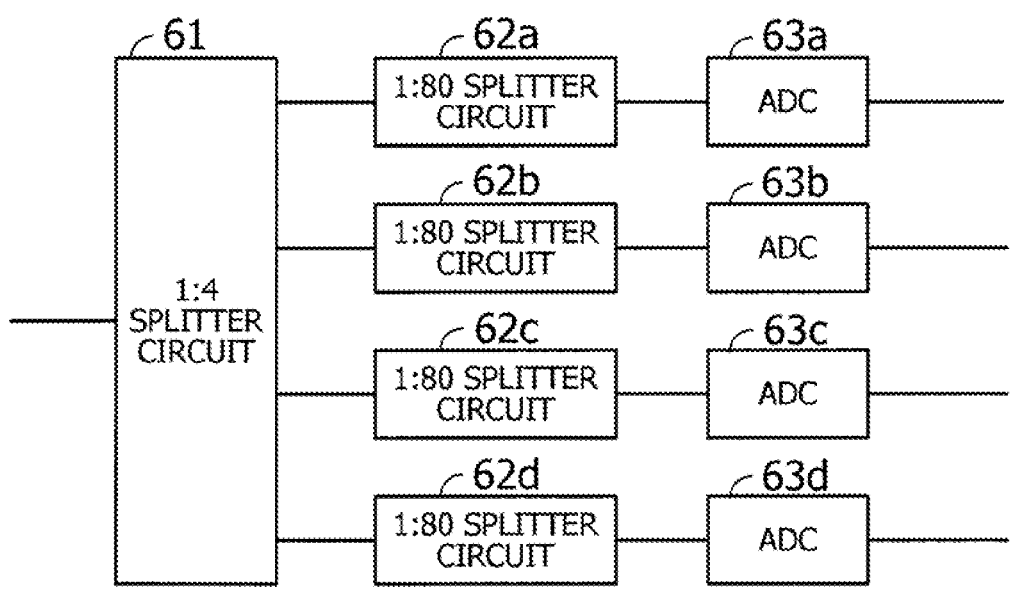
FIG. 7 illustrates details of an ADC.

Details of the ADC 44a in FIG. 5 will now be described below, with reference to FIG. 7. As can be seen from FIG. 7, the illustrated ADC 44a includes a 1:4 splitter circuit 61, 1:80 splitter circuits 62a to 62d, and ADCs 63a to 63d. While FIG. 7 illustrates only four ADCs, those ADCs actually include 320 ADCs in total. For example, eighty ADCs are coupled to each 1:80 splitter circuit 62a to 62d. In other words, each illustrated ADC 63a to 63d represents a block of eighty constituent ADCs. This block structure, as well as the following description, of the ADC 44a in FIG. 7 similarly applies to the other ADCs 44b to 44d in FIG. 5.

The 1:4 splitter circuit 61 receives as its input an analog electrical signal from the topmost TIA in the amplifier unit 43c seen in FIG. 5. The 1:4 splitter circuit 61 splits this input signal into four signals, one for each of the 1:80 splitter circuits 62a to 62d. The 1:80 splitter circuit 62a further splits the output of the 1:4 splitter circuit 61 into eighty signals and supplies them to the ADC 63a. As noted above, the ADC 63a is formed from eighty constituent ADCs. The eighty outputs of the 1:80 splitter circuit 62a are fed to those eighty constituent ADCs, respectively. After all the input signal entering the 1:4 splitter circuit 61 is divided into 320 portions and supplied to 320 constituent ADCs.

It is noted here that the above combination of 1:4 splitting and 1:80 splitting is only an example. The embodiments discussed herein are not limited by this specific example.

The ADCs 63a to 63d perform analog-to-digital conversion of the output signal of a TIA in the amplifier unit 43c in a time-interleaved manner. Here the ADC 63a to 63d achieve high-speed sampling by concurrently operating their 320 constituent ADCs with staggered sample times. For example, the 320 constituent ADCs may each operate at 437.5 MHz to successively sample a given input signal, which amounts to a total A/D conversion rate of 56 giga-samples per second (GSa/s).

There may be some amplitude variations and timing errors among the 320 constituent ADCs. The ADCs 63a to 63d are thus subjected to a correction process to correct their errors before starting the optical transmission apparatus 11 or at the time of maintenance. The correction process ensures proper reception (reproduction) of signals. Suppose, for example, that the ADCs are designed to output a digital value of 100 (in decimal) when they receive an analog input signal with a voltage of 1.2 V. In reality, however, some of those 320 ADCs may produce different digital values, such as 99 or 101, for the same 1.2-volt analog input signal. These ADCs hamper the optical transmission apparatus 11 from reproducing received signals properly. The ADCs 63a to 63d are thus corrected such that all constituent 320 ADCs will equally output the expected digital value of 100 for a 1.2-volt analog input signal. For proper reception of signals, it is also necessary to make the 320 constituent ADCs operate with uniform time differences. The correction process for ADCs 63a to 63d thus includes correction of their timing errors.

Figure 8:
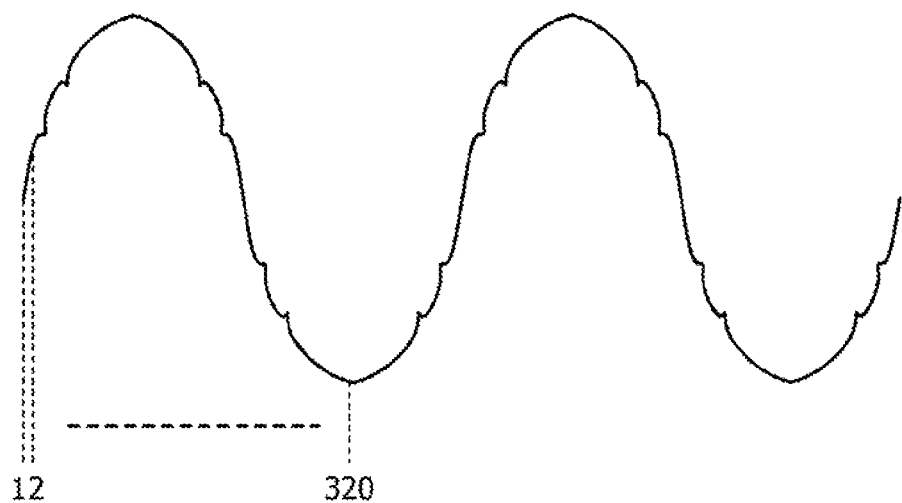
FIG. 8 illustrates analog-to-digital conversion performed with a plurality of ADCs.

FIG. 8 illustrates an example of analog-to-digital conversion performed by a plurality of ADCs. The illustrated signal waveform represents what the ADCs 63a to 63d produce when a sine wave is entered to the 1:4 splitter circuit 61 discussed above in FIG. 7. The numerals (1, 2, ... 320) seen in FIG. 8 correspond to 320 ADCs constituting the ADCs 63a to 63d, where the 320 constituent ADCs successively execute A/D conversion of the input signal in a time-interleaved fashion. The DSP 45 obtains digitized values of the input signal by, for example, combining those 320 ADC outputs.

As mentioned above, some of the 320 constituent ADCs may have amplitude errors. When this is the case, the sine wave output from the ADCs 63a to 63d exhibits some distortion as illustrated in FIG. 8. In addition to such amplitude errors, the 320 sample times may not be evenly spaced, thus adding other distortion in the sine wave output from the ADCs 63a to 63d as illustrated in FIG. 8. This is why the ADCs 63a to 63d are subject to amplitude error correction and timing error correction.

Figure 9:
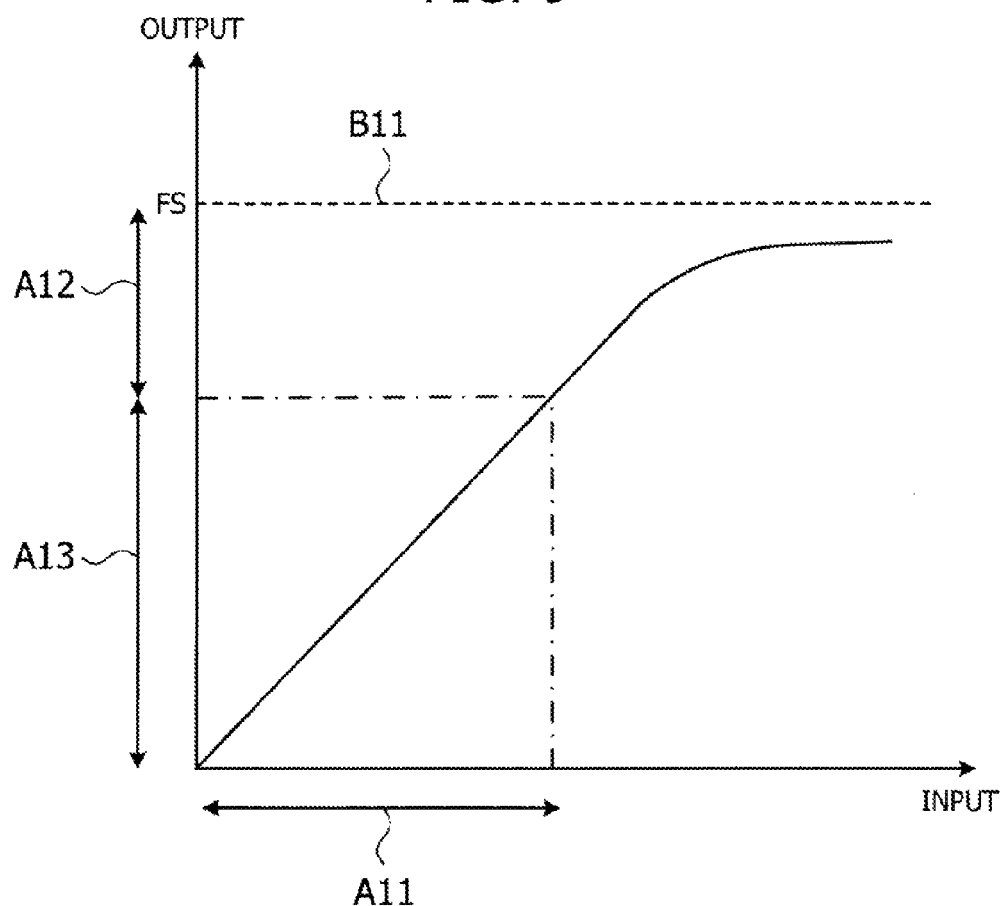
FIG. 9 illustrates input-output characteristics of a TIA when an optical transmission apparatus is in operation.

When the optical transmission apparatus 11 is in operation mode (i.e., when providing optical communication services), its internal TIAs are supposed to operate with input-output characteristics described below. FIG. 9 illustrates input-output characteristics of a TIA when the optical transmission apparatus 11 is in operation mode. Specifically, the graph of FIG. 9 represents input-output characteristics of the topmost TIA in the amplifier unit 43c seen in FIG. 5, where the horizontal axis and vertical axis represent input and output of the TIA, respectively. The TIA output goes to the ADC 44a as its analog input.

Referring to FIG. 9, arrow A11 indicates a specific amplitude of the input signal supplied to the TIA. Transmission signals would be degraded if there is a nonlinear distortion in TIAs. TIAs are thus supposed to operate in a linear range of their gain curve in order to avoid such degradation when the optical transmission apparatus 11 is in operation mode. As can be seen from the example of FIG. 9, the TIA amplifies an input signal with amplitude A11 in its linear range.

Broken line B11 in FIG. 9, on the other hand, indicates the full-scale input amplitude of the ADC 44a. As mentioned above, TIAs are used in their linear range to avoid degradation of transmission signals due to nonlinearity. For this reason, there is a gap between the full-scale input amplitude of the ADC 44a and the actual output amplitude supplied to the ADC 44a, as indicated by arrow A12 in FIG. 9. That is, the ADC 44a receives its input signal in the amplitude range indicated by arrow A13.

Amplitude and timing correction of the ADC 44a is performed preferably under the condition in which the ADC 44a converts input signals of various amplitudes. It is thus preferable, in correction mode, to vary the input signal amplitude within a wider range up to the full-scale input amplitude of the ADC 44a. The correction of the ADC 44a would miss the amplitude range indicated by arrow A12 if it is conducted without changing the input-output characteristics of TIAs illustrated in FIG. 9. This means that the optical transmission apparatus 11 would experience a degradation of the received transmission signal if its amplitude enters the range indicated by arrow A12 in FIG. 9.

In view of the above, the controller 51 takes part in the correction of the ADC 44a by controlling the gain of its associated TIA as discussed in FIG. 6. For example, the controller 51 varies the gain of the TIA so that the input signal of the ADC 44a swings up to or close to the full-scale amplitude of the ADC 44a. While the above discussion has focused on the topmost TIA in the amplifier unit 43c of FIG. 5 and its associated ADC 44a, the same discussion applies also to the other TIAs and their associated ADCs 44b to 44d. The following section provides more details of TIA control in the ADC correction, assuming the same TIA and ADC 44a.

Figure 10:
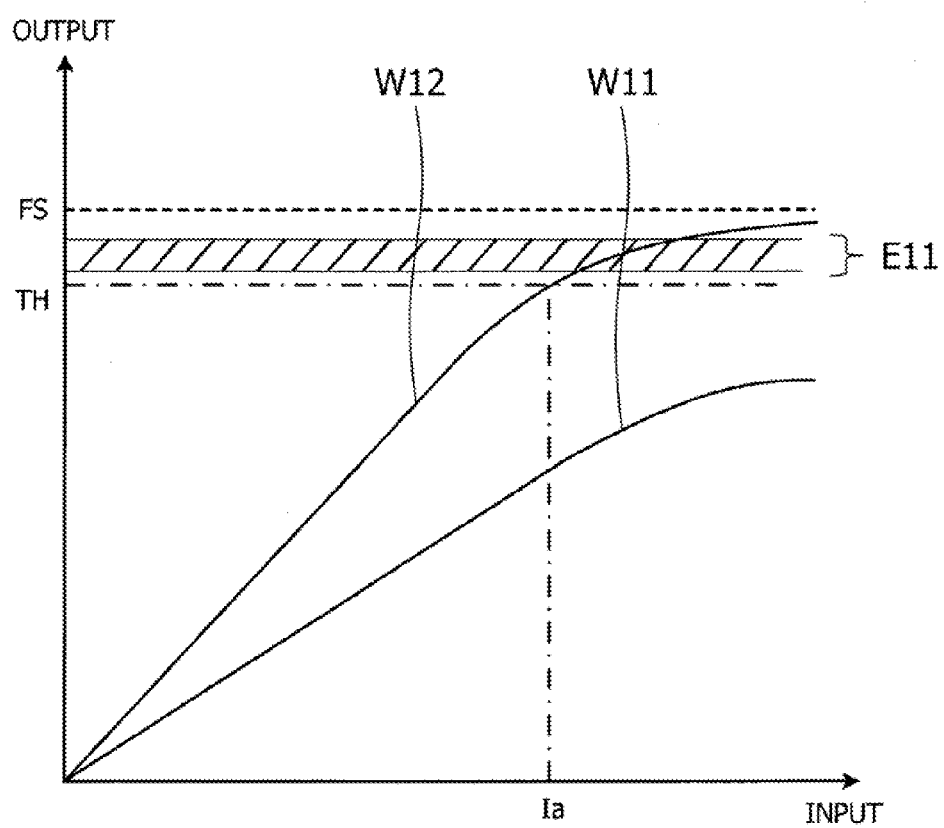
FIG. 10 illustrates how the gain of a TIA is controlled in a correction process.

FIG. 10 illustrates how the gain of a TIA is controlled in ADC correction. Specifically, the graph of FIG. 10 represents input-output characteristics of the topmost TIA in the amplifier unit 43c seen in FIG. 5, where the horizontal and vertical axes represent input and output of the TIA, respectively. The TIA output goes to the ADC 44a as its analog input.

Curve W11 seen in this FIG. 10 indicates input-output characteristics of the TIA when it is supplied with an amplitude control voltage of Va1 from the amplitude controller 47. Curve W12, on the other hand, indicates the same for another value Vb1 of the amplitude control voltage from the amplitude controller 47, where Vb1>Va1.

Symbol Ia in FIG. 10 indicates a specific amplitude of input current given to the TIA. As mentioned before, the TIA is supposed to work in its linear range when the optical transmission apparatus 11 is in operation mode, in order to avoid degradation of received transmission signals due to nonlinear distortion of the TIA. Accordingly the TIA is configured to respond to the given input signal amplitude Ia according to the input-output curve W11 seen in FIG. 10 when the optical transmission apparatus 11 is in operation mode. This setup is achieved by supplying the first-noted amplitude control voltage Va1 to the TIA. The input signal amplitude Ia is determined from optical power levels observed by the input monitor 46 as discussed previously in FIG. 5. That is, the observed optical power is proportional to the square of input signal amplitude of the TIA.

As noted above, it is preferable to supply an input signal with a full-scale amplitude FS to the TIA when it is in correction mode. The correction controller 21c in FIG. 5 thus controls the gain of TIAs via an amplitude controller 47 in such a way that the ADC 44a will receive an input signal having a full-scale amplitude. For example, the correction controller 21c causes TIAs to be supplied with amplitude control voltage Vb1, so that the TIAs will have the input-output characteristics indicated by curve W12 in FIG. 10. As a result, the TIA output signals swing up to or close to the full-scale input amplitude of the ADC 44a.

Since the ADC 44a does not have to receive (reproduce) any transmission signals during the course of ADC correction, its associated TIA is allowed to operate in its nonlinear region. While the above description has focused on the topmost TIA in the amplifier unit 43c of FIG. 5 and its associated ADC 44a, the same description applies also to the other TIAs and their associated ADCs 44b to 44d. Threshold TH and range E11 not explained in FIG. 10 will be described in a later section.

As mentioned in FIG. 6, the correction controller 21c includes a TIA setting table 52. The following section will describe this TIA setting table 52.

FIG. 11 illustrates example data of a TIA setting table. As seen in FIG. 11, the TIA setting table 52 has three data fields with the following titles: "Input Amplitude," "Operation-mode Amplitude Control Voltage," and "Adjustment-mode Amplitude Control Voltage."

The first field named "Input Amplitude" stores a specific input amplitude of signals that may be entered to TIAs. The next field named "Operation-mode Amplitude Control Voltage" contains a specific value of TIA control voltage that is to be applied to set the gain of a TIA when the optical transmission apparatus 11 is in operation mode. The last filed named "Adjustment-mode Amplitude Control Voltage" contains a specific value of TIA control voltage that is to be applied when the ADCs 44a to 44d are in correction mode.

The controller 51 in the correction controller 21c consults this TIA setting table 52 to select an operation-mode amplitude control voltage in accordance with the input signal amplitude of TIAs when the optical transmission apparatus 11 is in operation mode. The selected operation-mode amplitude control voltage enables the TIAs to amplify signals in their linear range. The controller 51 also consults the TIA setting table 52 to select a correction-mode amplitude control voltage in accordance with the input signal amplitude of TIAs when the A/D conversion unit 44 is in correction mode. The selected correction-mode amplitude control voltage enables correction of the A/D conversion unit 44 with its full scale range. Here the input signal amplitude of TIAs may be obtained from optical signal power levels monitored by the input monitor 46. In the TIA setting table 52, correction-mode amplitude control voltages are different from operation-mode amplitude control voltages. Specifically, the former voltages permit the ADCs 44a to 44d to be corrected with input signal amplitudes that are closer to the full-scale amplitude than those that result from the latter voltages when the optical transmission apparatus 11 is in operation mode.

The next section will provide more details about how the controller 51 discussed in FIG. 6 obtains an amplitude control voltage, as well as about threshold TH and range E11 mentioned previously in FIG. 10.

Before starting operation of the optical transmission apparatus 11, the device management unit 22 notifies a peer optical transmission apparatus 13 that the optical transmission apparatus 11 is going to start a correction process for the A/D conversion unit 44. This notification may also be made at the time of maintenance of the optical transmission apparatus 11. Upon such notification, the peer optical transmission apparatus 13 sends a pseudorandom bit sequence to the optical transmission apparatus 11. The device management unit 22 then issues a command to the controller 51 to correct the A/D conversion unit 44.

In response to the command, the controller 51 directs the A/D conversion unit 44 to start correction of its constituent ADCs. The controller 51 also calculates an input signal amplitude of TIAs in the amplifier unit 43c based on the optical power level of an incoming optical signal (pseudorandom bit sequence in this case) which is monitored by the input monitor 46. With the calculated input signal amplitude, the controller 51 obtains a correction-mode amplitude control voltage from the TIA setting table 52. The controller 51 then controls the amplitude controller 47 in order to apply the obtained correction-mode amplitude control voltage to TIAs. For example, when the controller 51 has calculated a specific input signal amplitude Ia, the amplitude controller 47 applies its corresponding voltage Vb1 to TIAs.

Digital signal outputs of each ADC 44a to 44d are monitored by the ADC output monitor 48. The controller obtains a total amplitude or an average amplitude of digital outputs of, for example, 320 ADCs constituting the ADC 44a. The controller 51 similarly obtains total amplitudes or average amplitudes of digital output produced by the other ADCs 44b to 44d.

The controller 51 examines each of the obtained total amplitudes or average amplitudes to determine whether it is equal to or greater than a specified value. For example, the controller 51 determines whether the obtained total amplitudes or average amplitudes are equal to or greater than threshold TH seen in FIG. 10. As the pseudorandom bit sequence varies in the amplitude, the A/D conversion unit 44 produces various values of digital outputs. Their total or average over time, however, take a certain constant value.

When the obtained total amplitude or average amplitude of digital outputs is smaller than the threshold TH, the controller 51 selects a new correction-mode amplitude control voltage from the TIA setting table 52. This new voltage is, for example, one step higher than the current correction-mode amplitude control voltage. For example, the controller 51 obtains a new correction-mode amplitude control voltage Vb2 next to the current correction-mode amplitude control voltage Vb1.

When it is found that the obtained total amplitude or average amplitude of digital outputs is equal to or greater than the threshold TH, the controller 51 determines whether the total amplitude or average amplitude has settled in a specified range above or over the threshold TH. For example, the controller 51 determines whether the total amplitude or average amplitude has settled in the range E11 illustrated in FIG. 10.

When it is found that the obtained total amplitude or average amplitude of digital outputs has settled in the range E11, the controller 51 concludes that the A/D conversion unit 44 has finished its ADC correction process, and thus notifies the device management unit 22 of the completion. Upon receipt of this notification, the device management unit 22 requests the peer optical transmission apparatus 13 to terminate transmission of the pseudorandom bit sequence and start sending a transmission signal.

The optical power level of the transmission signal is monitored by the input monitor 46. Based on this monitored power level, the controller 51 calculates an input signal amplitude of TIAs in the amplifier unit 43c. The controller 51 then consults the TIA setting table 52 to obtain an operation-mode amplitude control voltage corresponding to the calculated input signal amplitude. For example, when the calculated input signal amplitude has a value of Ia, the controller 51 obtains its corresponding voltage Va1 from the TIA setting table 52. The controller 51 thus controls the amplitude controller 47 in order to apply the obtained operation-mode amplitude control voltage Va1 to TIAs.

Figure 12:
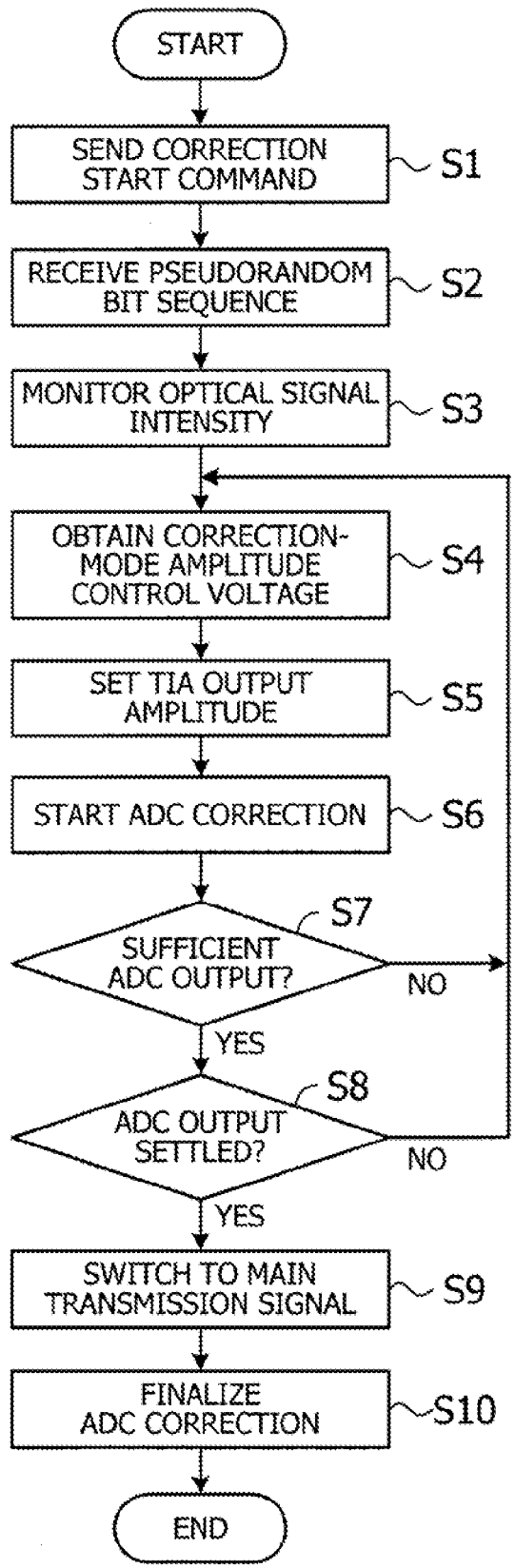
FIG. 12 is a flowchart illustrating an example of ADC correction according to the second embodiment.

FIG. 12 is a flowchart illustrating an example of ADC correction.

(Step S1) To start correction of the A/D conversion unit 44, the device management unit 22 sends a correction start command to the controller 51 in the correction controller 21c, as well as to a peer optical transmission apparatus 13 with which the optical transmission apparatus 11 is to communicate. In response to this correction start command, the peer optical transmission apparatus 13 starts transmission of a pseudorandom bit sequence toward the optical transmission apparatus 11.

(Step S2) The receiver 21b receives the pseudorandom bit sequence from the peer optical transmission apparatus 13.

(Step S3) The input monitor 46 monitors optical power levels of the incoming optical signal (pseudorandom bit sequence) by also using LO light supplied from the laser diode 42.

(Step S4) The controller 51 calculates an input signal amplitude of TIAs in the amplifier unit 43c from the optical power level of the incoming optical signal (pseudorandom bit sequence) which is monitored by the input monitor 46. Based on the calculated input signal amplitude, the controller 51 obtains a correction-mode amplitude control voltage from the TIA setting table 52.

(Step S5) The amplitude controller 47 receives the correction-mode amplitude control voltage obtained by the controller 51 and applies it to TIAs, thereby setting the TIA gain suitable for ADC correction.

(Step S6) The controller 51 sends an ADC correction command to ADCs 44a to 44d in the A/D conversion unit 44, where each of the four ADCs 44a to 44d includes, for example, 320 constituent ADCs. The ADCs 44a to 44d perform correction of, for example, their amplitude errors and timing errors in response to the command from the controller 51.

(Step S7) The ADC output monitor 48 monitors digital signals produced by the individual ADCs 44a to 44d (e.g., 320 ADCs ×4) and calculates their total amplitude or average amplitude. The controller 51 obtains that value of total amplitude or average amplitude and determines whether the obtained value is equal to or greater than a specified value (e.g., threshold TH). If the obtained value is found to be equal to or greater than the specified value, the controller 51 proceeds to step S8. If not, the controller 51 goes back to step S4. At step S4, the controller 51 selects a new correction-mode amplitude control voltage that is one step higher than the previous correction-mode amplitude control voltage.

(Step S8) The controller 51 determines whether the total amplitude or average amplitude has settled in a specified range above or over the threshold TH. If the total amplitude or average amplitude is found to be settled in the specified range, the controller 51 advances to step S9 to finalize the ADC correction. If not, the controller 51 goes back to step S4. At step S4, the controller 51 selects a new correction-mode amplitude control voltage that is one step higher than the previous correction-mode amplitude control voltage.

(Step S9) The controller 51 notifies the device management unit 22 that the A/D conversion unit 44 has been corrected properly. In response, the device management unit 22 commands the peer optical transmission apparatus 13 to stop supplying the pseudorandom bit sequence and instead start sending a transmission signal.

(Step S10) The controller 51 finalizes the ADC correction. For example, the controller 51 calculates an input signal amplitude of TIAs in the amplifier unit 43c from the optical power level of the incoming optical signal (transmission signal) which is monitored by the input monitor 46. The controller 51 then consults the TIA setting table 52 to obtain an operation-mode amplitude control voltage corresponding to the calculated input signal amplitude. The controller 51 also issues a command to the DSP 45 to start reproducing received signals.

The amplitude controller 47 receives the above operation-mode amplitude control voltage from the controller 51 and applies it to TIAs, thereby setting the TIA gain suitable for the optical transmission apparatus to provide service. The DSP 45 reproduces received signals from output data of the A/D conversion unit 44.

As can be seen from the above description, the optical transmission apparatus 11 according to the second embodiment is designed to control the gain of its amplifier 2 when correcting a plurality of ADCs 63a to 63d, so that the total amplitude or average amplitude of their outputs will be equal to or greater than a specified value and will fall within a specified range. With this feature of gain control, the correction brings the ADCs 63a to 63d to a more satisfactory state.

(c) Third Embodiment

A third embodiment will be described in detail below with reference to FIG. 13 and subsequent drawings. The foregoing second embodiment corrects ADCs in an optical transmission apparatus by using a pseudorandom bit sequence sent from a peer optical transmission apparatus. In contrast, according to the following third embodiment, an optical transmission apparatus is designed to use a self-produced pseudorandom bit sequence to correct ADCs.

Figure 13:
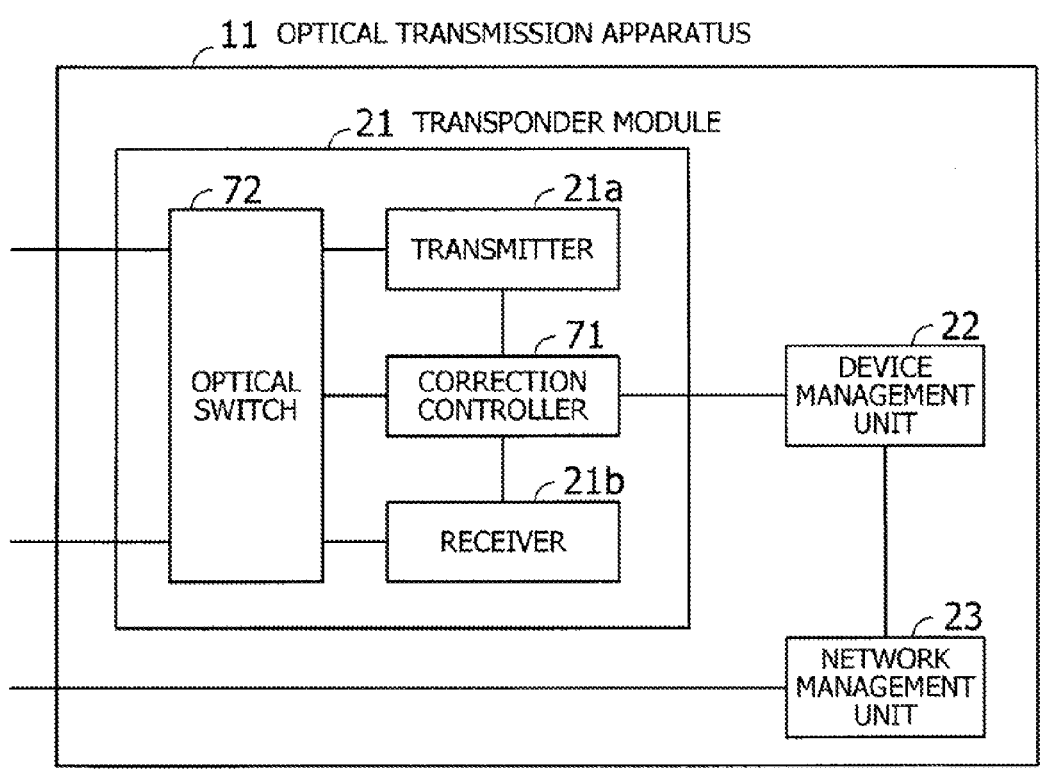
FIG. 13 is a block diagram illustrating an example of an optical transmission apparatus according to a third embodiment.

FIG. 13 is a block diagram illustrating an example of an optical transmission apparatus according to the third embodiment. FIG. 13 shares some reference numerals with FIG. 3 to designate similar elements. See the previous explanation for those elements.

As illustrated in FIG. 13, this optical transmission apparatus 11 includes a correction controller 71 and an optical switch 72 as part of its transponder module 21. In addition to providing the same functions as the correction controller 21c discussed in FIG. 3, the correction controller 71 changes connection paths in the optical switch 72 in response to a notice from the device management unit 22 which informs that the A/D converter is to start ADC correction.

The optical switch 72 changes its internal connection paths under the control of the correction controller 71. For example, when the optical transmission apparatus 11 is in operation mode, the optical switch 72 provides a path for an outgoing optical signal (transmission signal) from the transmitter 21a to a fiber optic link, together with another path that permits an incoming optical signal (transmission signal) from another fiber optic link to reach the receiver 21b. When the A/D converter is in the process of ADC correction, the optical switch 72 changes the paths to cause an outgoing optical signal (pseudorandom bit sequence) from the transmitter 21a to enter the receiver 21b. In other words, the optical switch 72 provides a loopback path for a pseudorandom bit sequence from the transmitter 21a to the receiver 21b during ADC correction.

Figure 14:
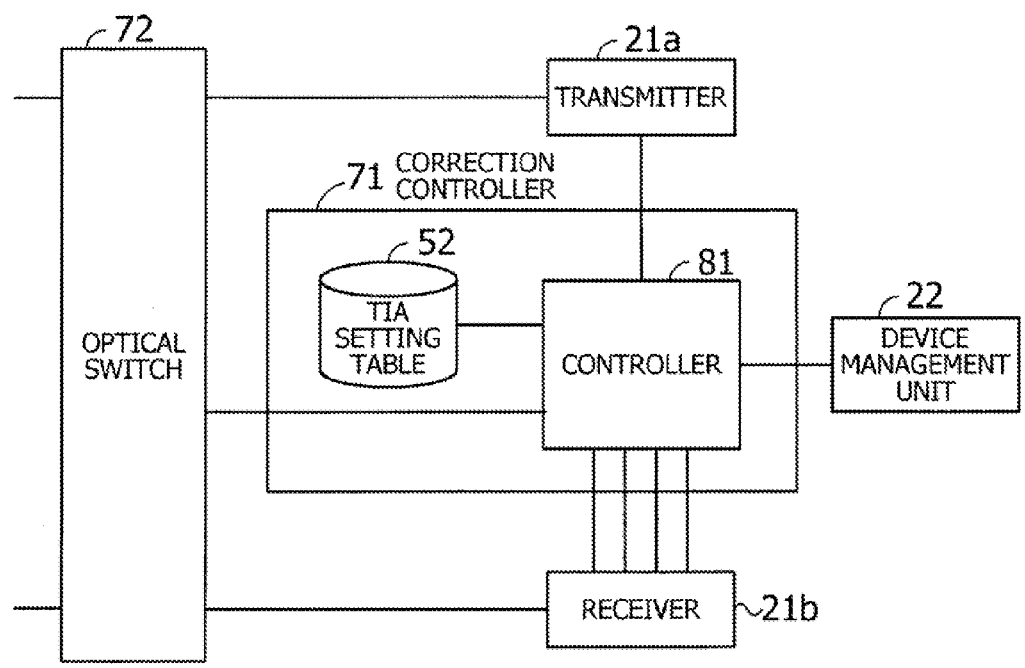
FIG. 14 is a block diagram illustrating an example of a correction controller.

The correction controller 71 in FIG. 13 will now be described in greater detail below, while skipping explanation for the transmitter 21a and receiver 21b because of their similarity to those discussed in FIGS. 4 and 5. FIG. 14 is a block diagram illustrating an example of the correction controller 71. FIG. 14 shares some reference numerals with FIG. 6 to designate similar elements. See the previous explanation for those elements. FIG. 14 illustrates several components of the correction controller 71 along with their surrounding components including the optical switch 72 described in FIG. 13.

The controller 81 functions similarly to the controller 51 discussed in FIG. 6. According to the third embodiment, the controller 81 further causes the optical switch 72 to change connection paths in response to a notice from the device management unit 22 which informs that the A/D converter is to start ADC correction. For example, the controller 81 causes the optical switch 72 to provide a path for an outgoing optical signal from the transmitter 21a to reach the receiver 21b. When the total amplitude or average amplitude of ADCs' digital signal outputs is equal to or greater than a specified threshold and also falls within a specified range, the controller 81 causes the optical switch 72 to change its internal paths for the optical transmission apparatus 11 to start its operation.

For example, the controller 81 causes the optical switch 72 to route an outgoing optical signal from the transmitter 21a to a fiber optic link, as well as to allow an incoming optical signal from another fiber optic link to reach the receiver 21b.

Figure 15:
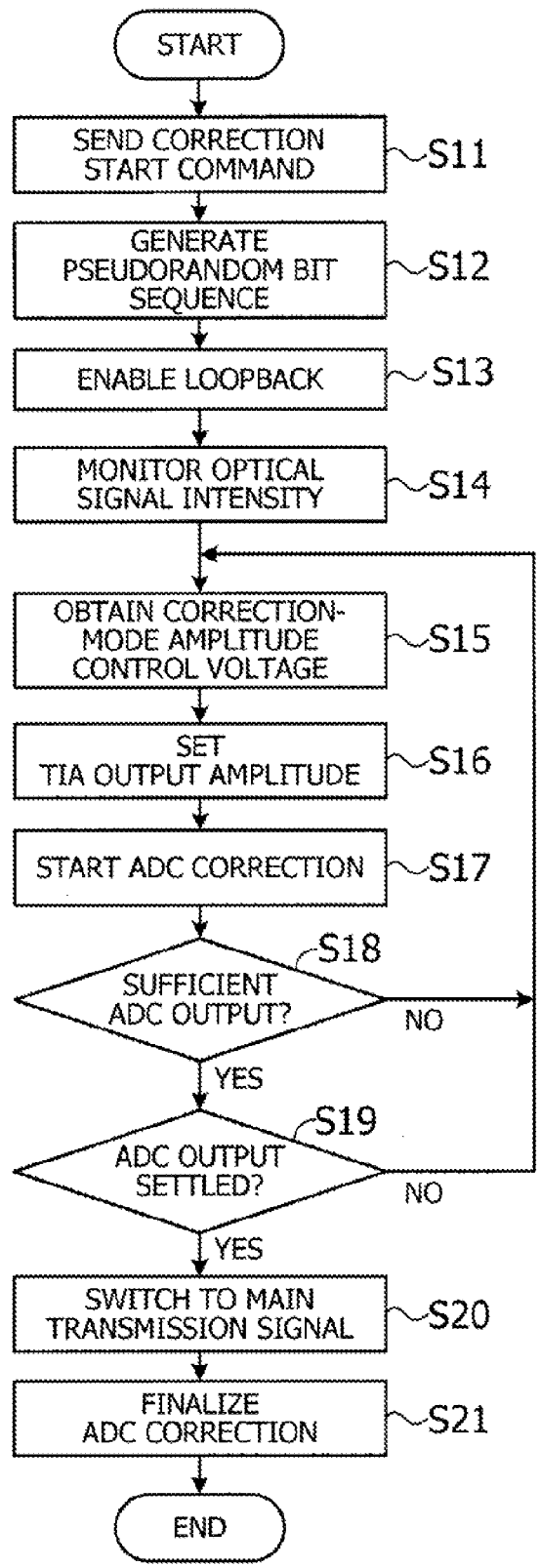
FIG. 15 is a flowchart illustrating an example of ADC correction according to the third embodiment.

FIG. 15 is a flowchart illustrating an example of ADC correction according to the third embodiment.

(Step S11) The device management unit 22 sends a correction start command to the controller 81 in the correction controller 71 to start correction of the A/D conversion unit 44.

(Step S12) In response to the correction start command from the correction controller 71, the transmitter 21a starts generating a pseudorandom bit sequence.

(Step S13) The controller 81 causes the optical switch 72 to set up a loopback path. That is, the controller 81 causes the optical switch 72 to change its connection paths so as to route an optical signal carrying the pseudorandom bit sequence from the transmitter 21a to the receiver 21b.

(Steps S14 to S19) The controller 81, input monitor 46, amplitude controller 47, and ADC output monitor 48 execute TIA gain control and ADC correction. Steps S14 to S19 are similar to steps S3 to S8 described previously in FIG. 12. Refer to the description of the corresponding steps in FIG. 12 for details of steps S14 to S19.

(Step S20) The controller 81 commands the optical switch 72 to change the connection paths to enable normal operation of the optical transmission apparatus 11. For example, the controller 81 causes the optical switch 72 to provide a path for an outgoing optical transmission signal from the transmitter 21a to be sent out to the peer optical transmission apparatus 13. The controller 81 also causes the optical switch 72 to provide a path for the receiver 21b to receive an incoming optical transmission signal on the fiber optic link from the peer optical transmission apparatus 13. The controller 81 further notifies the device management unit 22 that the A/D conversion unit 44 has been corrected properly.

(Step S21) The controller 81 finalizes the ADC correction. Step S21 is similar to step S10 described previously in FIG. 12. Refer to the description of step S10 in FIG. 12 for details of this step S21.

As can be seen from the above description, the optical transmission apparatus 11 according to the third embodiment has an optical switch 72 to loop back a pseudorandom bit sequence generated by its own transmitter 21a. This configuration of the optical transmission apparatus 11 allows its peer optical transmission apparatus 13 to perform other processing (e.g., communication with other optical transmission apparatuses), without the need for sending a pseudorandom bit sequence for use in ADC correction in the optical transmission apparatus 11.

(d) Fourth Embodiment

A fourth embodiment will be described in detail below with reference to FIG. 16 and subsequent drawings. Some optical transmission apparatuses have a laser diode capable of producing LO light with a variable power level depending on in what optical communications system they are used. In this type of optical transmission apparatuses, the input signal amplitude of TIAs may vary with the power level of LO light produced by the laser diode. The fourth embodiment thus employs a plurality of TIA setting tables corresponding to different optical power levels of LO light and selects an appropriate TIA setting table for the actual LO light power level. The optical transmission apparatus of the fourth embodiment is formed from functional blocks similar to those discussed in FIG. 3, including the transmitter 21a described in FIG. 4. Refer to the preceding sections for details of those blocks.

Figure 16:
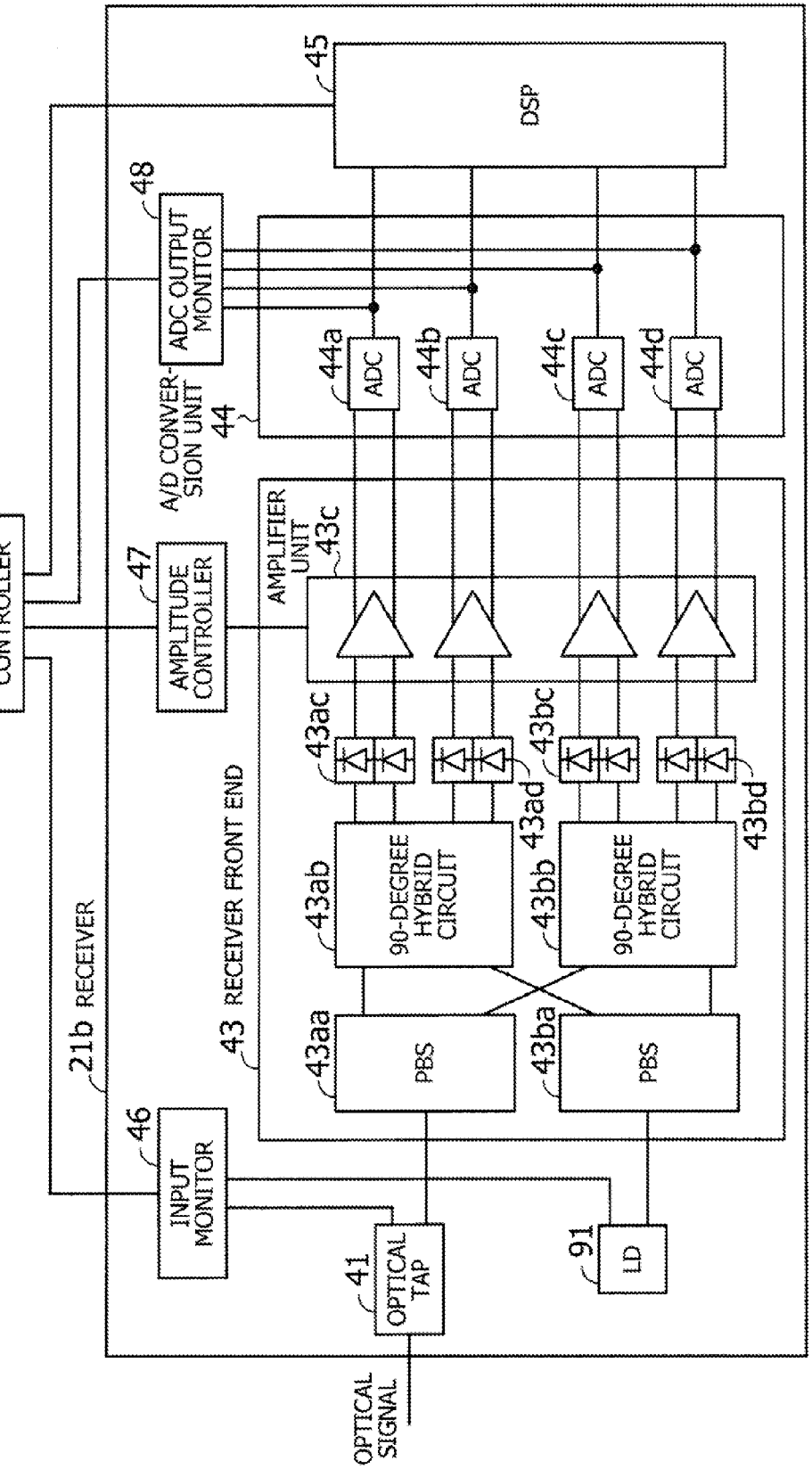
FIG. 16 is a block diagram illustrating an example of a receiver according to a fourth embodiment.

FIG. 16 is a block diagram illustrating an example of a receiver according to the fourth embodiment. FIG. 16 shares most reference numerals with FIG. 5 to designate similar elements. See the previous explanation for those elements.

The illustrated receiver 21b of FIG. 16 is different from the foregoing receiver 21b of FIG. 5 in its laser diode 91 for LO light generation. This laser diode in the fourth embodiment is capable of producing LO light with different optical power levels. For example, the laser diode 91 produces LO light with optical power levels of 10 mW and 20 mW in a selective manner. The device management unit 22 selects which of those two optical levels to use for the output of the laser diode 91. For example, the device management unit 22 selects 10 mW as the LO light power when the optical communications system requires that optical power level. The device management unit 22 selects 20 mW as the LO light power when the optical communications system requires that optical power level.

Figure 17:
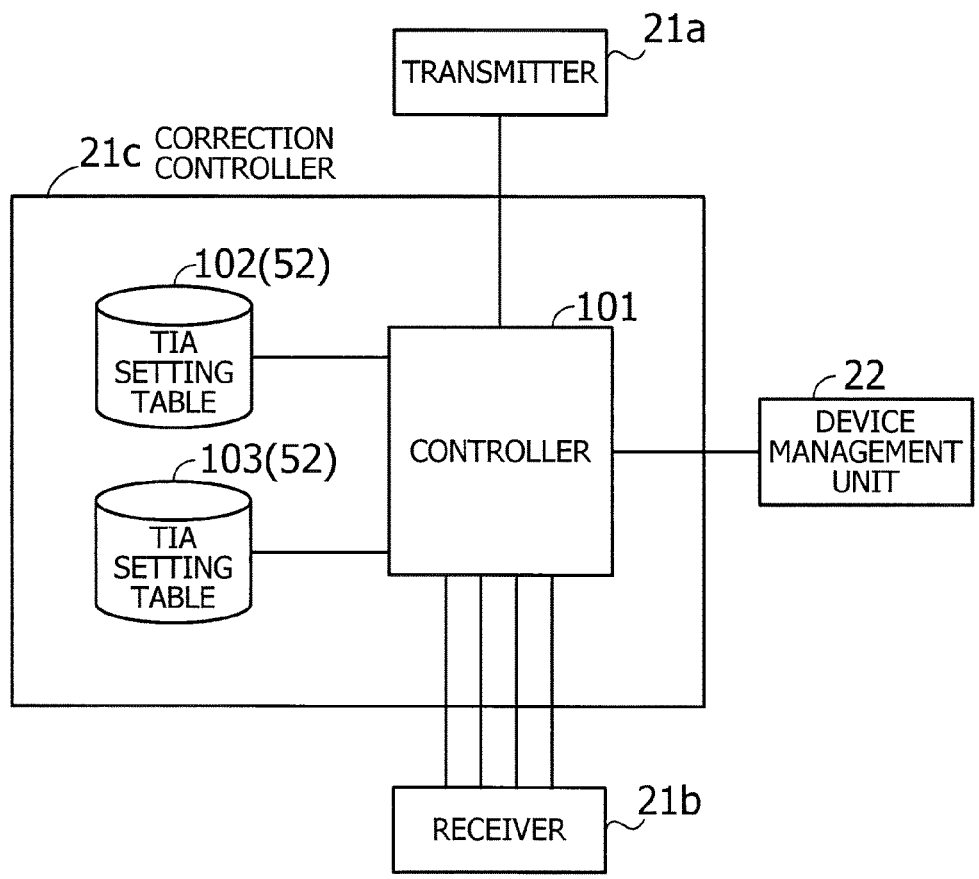
FIG. 17 is a block diagram illustrating an example of a correction controller.

FIG. 17 is a block diagram illustrating an example of the correction controller 21c. FIG. 17 shares some reference numerals with FIG. 6 to designate similar elements. See the previous explanation for those elements.

The illustrated controller 101 functions similarly to the controller 51 discussed in FIG. 6. In addition to that, the controller 101 receives information on the output power of LO light produced by the laser diode 91, as part of a correction start command that the device management unit 22 issues in ADC correction. The controller 101 selects and consults an appropriate TIA setting table 102 or 103 according to the optical power level information, in both cases of correction mode and operation mode.

TIA setting tables 102 and 103 have been prepared for different optical power levels of LO light that the laser diode 91 may produce. For example, one TIA setting table 102 contains data of input amplitude, operation-mode amplitude control voltage, and correction-mode amplitude control voltage for use when the LO light power level is P1. The other TIA setting table 103 contains the same for use when the LO light power level is P2. In the case where the laser diode 91 is capable of producing LO light with three or more different power levels, the correction controller 21c includes three or more TIA setting tables for the respective power levels.

Figure 18:
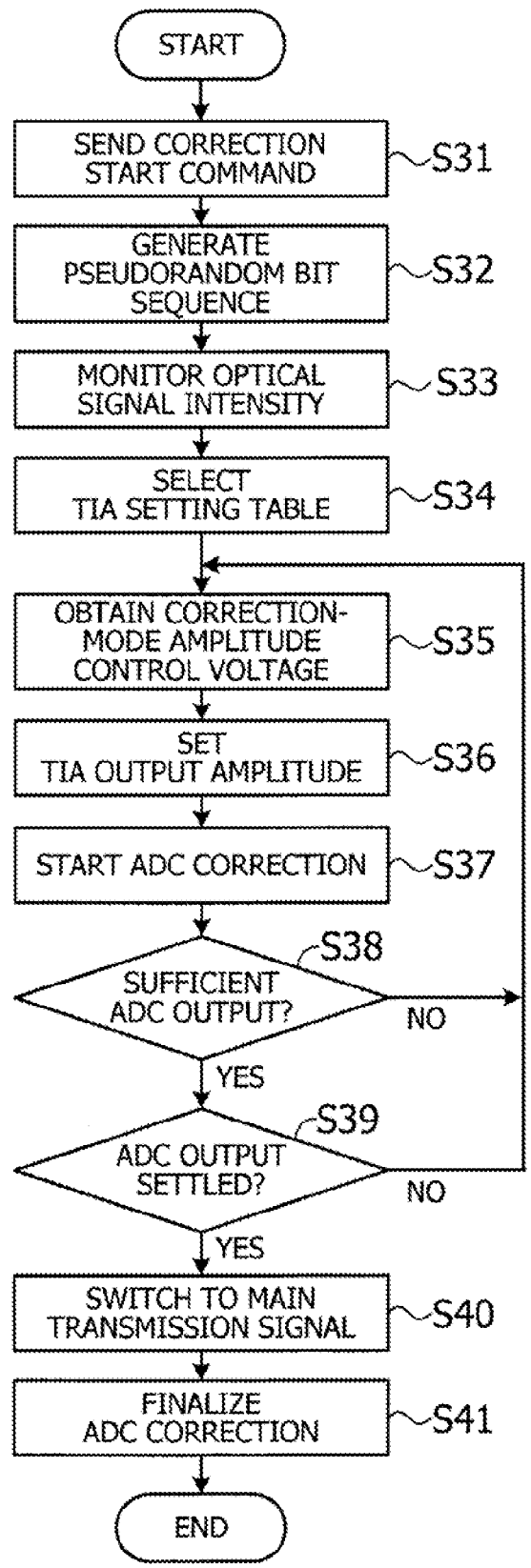
FIG. 18 is a flowchart illustrating an example of ADC correction according to the fourth embodiment.

FIG. 18 is a flowchart illustrating an example of ADC correction according to the fourth embodiment.

(Step S31) To start correction of the A/D conversion unit 44, the device management unit 22 sends a correction start command to the controller 101 in the correction controller 21c, as well as to a peer optical transmission apparatus 13 with which the optical transmission apparatus 11 is to communicate. Here the device management unit 22 includes information on the output power level of LO light produced by the laser diode 91, as part of the correction start command to the controller 101. This information is referred to herein as LO light power information.

(Steps S32 and S33) The receiver 21b receives a pseudorandom bit sequence, and the input monitor 46 monitors its optical power levels. Steps S32 and S33 are similar to steps S2 and S3 described previously in FIG. 12. Refer to the description of the corresponding steps in FIG. 12 for details of steps S32 and S33.

(Step S34) The controller 101 selects one of the TIA setting tables 102 and 103 which fits the LO light power information received at step S31. For illustrative purposes, it is assumed here that the LO light power information at step S31 indicates LO light power level P1, making the controller 101 select the former TIA setting table 102.

(Step S35) The controller 101 calculates an input signal amplitude of TIAs in the amplifier unit 43c from the incoming optical power level being monitored by the input monitor 46. Based on the calculated input signal amplitude, the controller 101 obtains a correction-mode amplitude control voltage from the selected TIA setting table 102.

(Step S36) The amplitude controller 47 receives the correction-mode amplitude control voltage obtained by the controller 101 and applies it to TIAs, thereby setting the TIA gain suitable for ADC correction.

(Step S37) The controller 101 sends an ADC correction command to ADCs 44a to 44d in the A/D conversion unit 44, where each of those four ADCs 44a to 44d includes, for example, 320 constituent ADCs. The ADCs 44a to 44d perform correction of, for example, their amplitude errors and timing errors in response to the command from the controller 101.

(Step S38) The ADC output monitor 48 monitors digital signals produced by the individual ADCs 44a to 44d (e.g., 320 ADCs ×4) and calculates their total amplitude or average amplitude. The controller 101 obtains that value of total amplitude or average amplitude and determines whether the obtained value is equal to or greater than a specified value. If the obtained value is found to be equal to or greater than the specified value, the controller 101 proceeds to step S39. If not, the controller 101 goes back to step S35. At step S35, the controller 101 selects a new correction-mode amplitude control voltage that is one step higher than the previous correction-mode amplitude control voltage.

(Step S39) The controller 101 determines whether the total amplitude or average amplitude has settled in a specified range above or over the threshold TH. If the total amplitude or average amplitude is found to be settled in the specified range, the controller 101 advances to step S40 to finalize the ADC correction. If not, the controller 101 goes back to step S35. At step S35, the controller 101 selects a new correction-mode amplitude control voltage that is one step higher than the previous correction-mode amplitude control voltage.

(Step S40) The controller 101 notifies the device management unit 22 that the A/D conversion unit 44 has been corrected properly. In response, the device management unit 22 commands the peer optical transmission apparatus 13 to stop supplying the pseudorandom bit sequence and instead start sending a transmission signal.

(Step S41) The controller 101 finalizes the ADC correction. For example, the controller 101 calculates an input signal amplitude of TIAs in the amplifier unit 43c from the optical power level of the incoming optical signal (transmission signal) which is monitored by the input monitor 46. Based on the calculated input signal amplitude, the controller 101 obtains an operation-mode amplitude control voltage from the selected TIA setting table 102. The controller 101 also issues a command to the DSP 45 to start signal processing.

The amplitude controller 47 receives the operation-mode amplitude control voltage that the controller 101 has obtained, and applies it to TIAs, thereby setting the TIA gain suitable for the optical transmission apparatus 11 to provide service. The DSP 45 reproduces received signals from output data of the A/D conversion unit 44.

As can be seen from the above, the optical transmission apparatus 11 according to the fourth embodiment is designed to select one of the two TIA setting tables 102 and 103 according to optical power levels of LO light produced by the laser diode 91. This feature enables proper correction of ADCs even in the case where the LO light power level may be varied depending on in what optical communications system the optical transmission apparatus 11 is used.

(e) Fifth Embodiment

A fifth embodiment will be described in detail below with reference to FIG. 19 and subsequent drawings. The fifth embodiment enables loopback of a pseudorandom bit sequence in the case where a plurality of TIA setting tables are provided to deal with different power levels of LO light. In other words, the fifth embodiment is a combination of the foregoing third and fourth embodiments. The optical transmission apparatus, transmitter, and receiver according to the fifth embodiment are each formed from functional blocks similar to those discussed in FIG. 13, FIG. 4, and FIG. 16, respectively. Refer to the preceding sections for details of those blocks.

Figure 19:
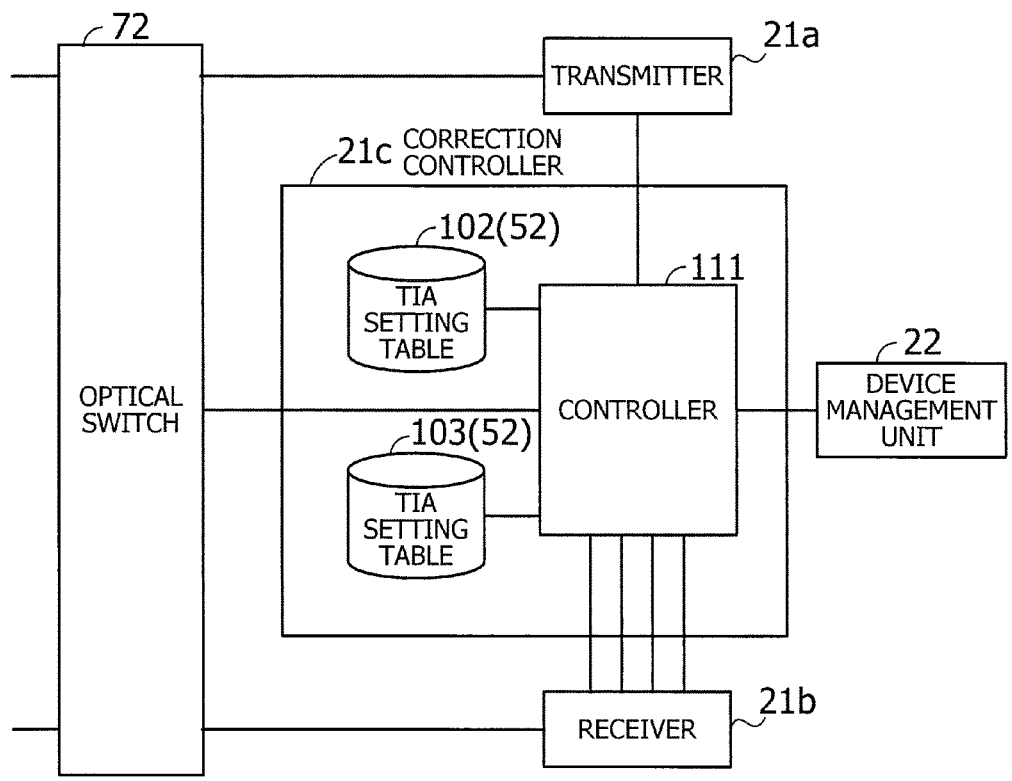
FIG. 19 is a block diagram illustrating an example of a correction controller according to a fifth embodiment.

FIG. 19 is a block diagram illustrating an example of a correction controller according to the fifth embodiment. FIG. 19 shares some reference numerals with FIGS. 14 and 17 to designate similar elements. See the previous explanation for those elements. Besides illustrating a transmitter 21a, a correction controller 21c, and a receiver 21b as in FIG. 17, FIG. 19 includes an optical switch 72 as in FIG. 14.

The illustrated controller 111 functions similarly to the controller 101 discussed in FIG. 17. The controller 111 also functions similarly to the controller discussed in FIG. 14. That is, the controller 111 selects one of two TIA setting tables 102 and 103 depending on the optical power level of LO light produced by a laser diode 91 in the receiver 21b, while it changes connection paths in the optical switch 72 depending on whether the optical transmission apparatus 11 is in operation mode or in ADC correction.

Figure 20:
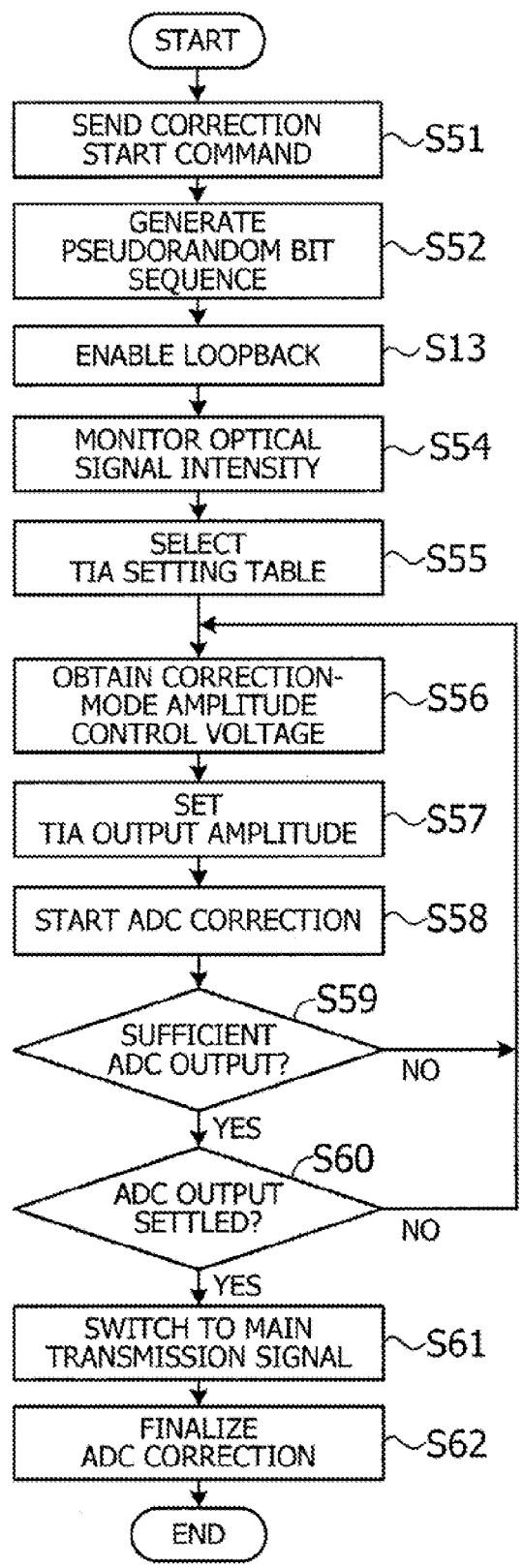
FIG. 20 is a flowchart illustrating an example of ADC correction according to the fifth embodiment.

FIG. 20 is a flowchart illustrating an example of ADC correction according to the fifth embodiment.

(Step S51) To start correction of the A/D conversion unit 44, the device management unit 22 sends a correction start command to the controller 111. Here the device management unit 22 includes LO light power information indicating the output power level of LO light produced by the laser diode 91, as part of the correction start command to the controller 111.

(Step S52) In response to the correction start command from the correction controller 71, the transmitter 21a starts generating a pseudorandom bit sequence.

(Step S53) The controller 111 causes the optical switch 72 to set up a loopback path. That is, the controller 111 causes the optical switch 72 to change its connection paths so as to route an optical signal carrying the pseudorandom bit sequence from the transmitter 21a to the receiver 21b.

(Step S54) The input monitor 46 monitors optical power levels of the incoming optical signal (pseudorandom bit sequence) by also using LO light supplied from the laser diode 42.

(Step S55) The controller 111 selects one of the TIA setting tables 102 and 103 which is suitable for the LO light power information received at step S51.

(Steps S56 to S60) The controller 111, input monitor 46, amplitude controller 47, and ADC output monitor 48 execute TIA gain control and ADC correction. Steps S56 to S60 are similar to steps S35 to S39 described previously in FIG. 18. Refer to the description of the corresponding steps in FIG. 18 for details of steps S56 to S60.

(Step S61) The controller 111 commands the optical switch 72 to change the connection paths to enable normal operation of the optical transmission apparatus 11. For example, the controller 111 causes the optical switch 72 to provide a path for an outgoing optical transmission signal from the transmitter 21a to be sent out to the peer optical transmission apparatus 13. The controller 111 also causes the optical switch 72 to provide a path for the receiver 21b to receive an incoming optical transmission signal on the fiber optic link from the peer optical transmission apparatus 13. The controller 111 further notifies the device management unit 22 that the A/D conversion unit 44 has been corrected properly.

(Step S62) The controller 111 finalizes the ADC correction. Step S62 is similar to step S10 described previously in FIG. 12. Refer to the description of step S10 in FIG. 12 for details of this step S62.

As can be seen from the above, the optical transmission apparatus 11 according to the fifth embodiment has an optical switch 72 to loop back a pseudorandom bit sequence generated by its own transmitter 21a. The optical transmission apparatus 11 is also designed to select one of the two TIA setting tables 102 and 103 according to optical power levels of LO light produced by the laser diode 91. The former feature of the optical transmission apparatus 11 allows its peer optical transmission apparatus 13 to perform other processing, without the need for sending a pseudorandom bit sequence for use in ADC correction in the optical transmission apparatus 11. The latter feature, on the other hand, enables the optical transmission apparatus 11 to perform correction of ADCs even in the case where the LO light power level is varied depending on in what optical communications system the optical transmission apparatus 11 is used.

(f) Sixth Embodiment

A sixth embodiment will be described in detail below with reference to FIG. 21 and subsequent drawings. Recall that the foregoing second embodiment monitors the optical power of an incoming optical signal entering the receiver front end 43 discussed in FIG. 5 and calculates the input signal amplitude of TIAs from the monitored optical power. In contrast, the sixth embodiment is designed to monitor the input signal amplitudes of individual TIAs directly. The optical transmission apparatus, transmitter, and correction controller according to the sixth embodiment are formed from functional blocks similar to those discussed in FIG. 3, FIG. 4, and FIG. 6, respectively. Refer to the preceding sections for details of those blocks.

Figure 21:
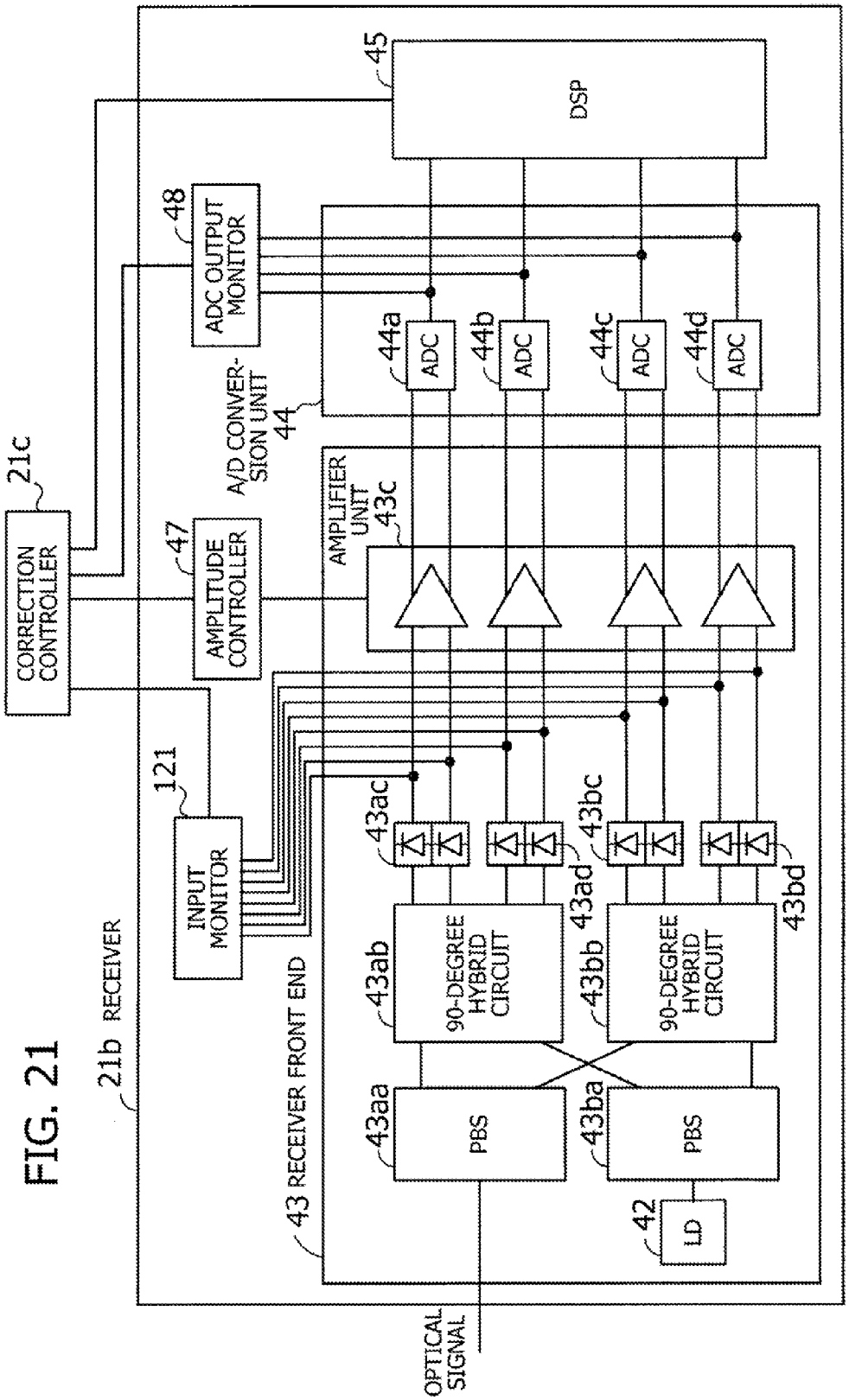
FIG. 21 is a block diagram illustrating an example of a receiver according to a sixth embodiment.

FIG. 21 is a block diagram illustrating an example of a receiver according to the sixth embodiment. FIG. 21 shares some reference numerals with FIG. 5 to designate similar elements. See the previous explanation for those elements.

The receiver illustrated in FIG. 21 is different from its counterpart in FIG. 5 in that an input monitor 121 is placed in front of the amplifier unit 43c. This input monitor 121 is coupled to each input of TIAs constituting the amplifier unit 43c to monitor the amplitude of individual input signals.

The controller 51 discussed in FIG. 6 calculates input signal amplitudes of TIAs, based on the observed optical power level of an optical signal received by the receiver front end 43. With the receiver design illustrated in FIG. 21, the controller 51 does not have to calculate input signal amplitudes because the input monitor 121 provides them.

Figure 22:
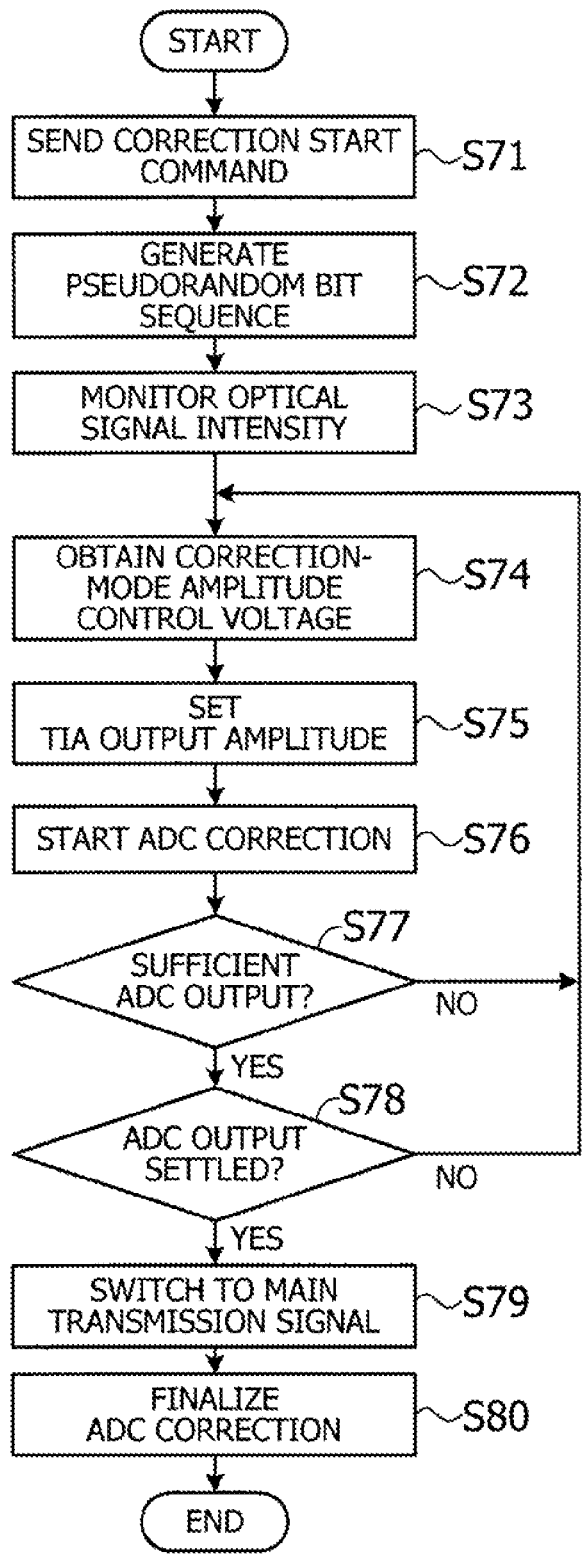
FIG. 22 is a flowchart illustrating an example of ADC correction according to the sixth embodiment.

FIG. 22 is a flowchart illustrating an example of ADC correction according to the sixth embodiment.

(Steps S71 and S72) The device management unit 22 sends a correction start command, and the receiver 21b receives a pseudorandom bit sequence. Steps S71 and S72 are similar to steps S1 and S2 described previously in FIG. 12. Refer to the description of the corresponding steps in FIG. 12 for details of steps S71 and S72.

(Step S73) The input monitor 121 monitors the input signal amplitude of each TIA in the amplifier unit 43c.

(Step S74) The controller 51 obtains a correction-mode amplitude control voltage from the TIA setting table 52, based on the input signal amplitudes monitored by the input monitor 121.

(Steps S75 to S79) The controller 51, amplitude controller 47, and ADC output monitor 48 execute TIA gain control and ADC correction. Steps S75 to S79 are similar to steps S5 to S9 described previously in FIG. 12. Refer to the description of the corresponding steps in FIG. 18 for details of steps S75 to S79.

(Step S80) The controller 51 finalizes the ADC correction. For example, the controller 51 obtains an operation-mode amplitude control voltage from the TIA setting table 52, based on the input signal amplitudes monitored by the input monitor 121. The controller 51 also issues a command to the DSP 45 to start signal processing.

As can be seen from the above description, the optical transmission apparatus 11 according to the sixth embodiment achieves appropriate ADC correction by monitoring electrical signals at the inputs of each TIA. The sixth embodiment may be implemented in combination with one or more of the foregoing third to fifth embodiments. That is, the features of making a loopback in the optical switch may be combined with the sixth embodiment. Also the features of selecting TIA setting tables may be combined with the sixth embodiment.

The foregoing second to sixth embodiments control the gain of TIAs by applying a selected correction-mode amplitude control voltage to all the TIAs in the course of ADC correction. It is noted, however, that the embodiments are not limited by that collective gain control of TIAs. For example, the embodiments may be modified to determine an appropriate correction-mode amplitude control voltage for each individual pair of TIA and ADC according to the total amplitude or average amplitude indicated by digital outputs of that ADC. In this case, different control voltages may be applied to different TIAs, as necessary, to compensate for differences in their input-to-output characteristics.

The controller 4, the controller 51, the controller 81, the controller 101, the controller 111 and the amplitude controller 47 can be comprised by a processor and a program, a circuit, or a Field-Programmable Gate Array (FPGA).

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that various changes, substitutions, and alterations could be made hereto without departing from the spirit and scope of the invention.

What is claimed is:

1. An optical transmission apparatus which receives and transmits optical signals, comprising:
    an optical-to-electrical converter which converts a received optical signal into an electrical signal;
    an amplifier which amplifies the electrical signal;
    a plurality of analog-to-digital converters which convert the amplified electrical signal from analog form to digital form in a time-interleaved manner to produce digital outputs;
    a controller which varies gain of the amplifier when correcting the analog-to-digital converters, in such a way that a total amplitude or an average amplitude indicated by the digital outputs of the plurality of analog-to-digital converters is equal to or greater than a predetermined threshold; and a memory which stores a table including information that associates a plurality of specific amplitudes of the electrical signal supplied as an input to the amplifier with a plurality of specific operation-mode voltages supplied to the amplifier when the optical transmission apparatus is in operation mode, as well as with a plurality of specific correction-mode voltages supplied to the amplifier when the analog-to-digital converters are in correction mode.

2. The optical transmission apparatus according to claim 1, wherein the controller varies the gain of the amplifier in such a way that the total amplitude or average amplitude settles in a specified range, besides being equal to or greater than the predetermined threshold.

3. The optical transmission apparatus according to claim 1, wherein:

the controller consults the table, when the analog-to-digital converter are in correction mode, to obtain one of the plurality of specific correction-mode voltages supplied to the amplifier which is associated with an actual amplitude of the electrical signal being supplied as the input to the amplifier; and the controller consults the table again to obtain another one of the plurality of specific correction-mode voltages which is one step greater than the specific correction-mode voltage obtained previously, when the total amplitude or average amplitude is smaller than the predetermined threshold.

4. The optical transmission apparatus according to claim 3, further comprising a monitor to observe an optical power level of the received optical signal, wherein the controller calculates an amplitude of the electrical signal supplied as the input to the amplifier, based on the optical power level observed by the monitor, and consults the table by using the calculated amplitude of the electrical signal.

5. The optical transmission apparatus according to claim 3, further comprising a monitor to observe the amplitude of the electrical signal supplied as the input to the amplifier, wherein the controller consults the table by using the calculated amplitude of the electrical signal which is observed by the monitor.

6. The optical transmission apparatus according to claim 1, wherein the table is provided in plurality, corresponding to different levels of local light used to demodulate the received optical signal.

7. The optical transmission apparatus according to claim 1, wherein the optical transmission apparatus is coupled to a peer optical transmission apparatus which sends a pseudorandom bit sequence for use in correction of the analog-to-digital converters.

8. The optical transmission apparatus according to claim 1, further comprising:

a transmitter which selectively transmits either a pseudorandom bit sequence or a transmission signal to a peer optical transmission apparatus; and a switch which provides two switched output paths of the transmitter, one for use when the analog-to-digital converters are in correction mode to permit the pseudorandom bit sequence to reach the amplifier, the other for use when the optical transmission apparatus is in operation mode to send the transmission signal out to the peer optical transmission apparatus.

9. An analog-to-digital conversion apparatus for converting a signal from analog form to digital form, the apparatus comprising:

an amplifier which amplifies the signal;

a plurality of analog-to-digital converters which convert the amplified electrical signal from analog form to digital form in a time-interleaved manner to produce digital outputs;

a controller which varies gain of the amplifier when correcting the analog-to-digital converters, in such a way that a total amplitude or an average amplitude indicated by the digital outputs of the plurality of analog-to-digital converters is equal to or greater than a predetermined threshold; and a memory which stores a table including information that associates a plurality of specific amplitudes of the electrical signal supplied as an input to the amplifier with a plurality of specific operation-mode voltages supplied to the amplifier when the analog-to-digital conversion apparatus is in operation mode, as well as with a plurality of specific correction-mode voltages supplied to the amplifier when the analog-to-digital converters are in correction mode.

* * * * *